(12) United States Patent
del Puerto et al.

(10) Patent No.: US 7,249,925 B2
(45) Date of Patent: *Jul. 31, 2007

(54) SYSTEM AND METHOD FOR RETICLE PROTECTION AND TRANSPORT

(75) Inventors: Santiago E. del Puerto, Milton, NY (US); Michael A. DeMarco, Victor, NY (US); Glenn M. Friedman, Redding, CT (US); Jorge S. Ivaldi, Trumbull, CT (US); James A. McClay, Oxford, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/282,474

(22) Filed: Nov. 21, 2005

(65) Prior Publication Data

US 2006/0078407 A1 Apr. 13, 2006

Related U.S. Application Data

(60) Division of application No. 10/216,660, filed on Aug. 12, 2002, now Pat. No. 6,991,416, which is a continuation-in-part of application No. 09/925,722, filed on Aug. 10, 2001, now Pat. No. 6,619,903.

(51) Int. Cl.
*H01L 21/68* (2006.01)
(52) U.S. Cl. .................. 414/331.14; 414/805; 414/940
(58) Field of Classification Search ................ 414/217, 414/217.1, 274, 331.14, 331.18, 416, 805, 414/806, 940
See application file for complete search history.

(56) References Cited

U.S. PATENT DOCUMENTS 4,145,597 A 3/1979 Yasuda 4,666,479 A 5/1987 Shoji (Continued)

FOREIGN PATENT DOCUMENTS

WO    WO 01/81203 A1 * 11/2001

OTHER PUBLICATIONS

Yoshitake, S. et al., "New Mask Blank Handling System for the Advanced Electron Beam Writer," 19th Annual BACUS Symposium on Photomask Technology, Monterey, California, Sep. 1999, SPIE, vol. 3873, pp. 905-915.

*Primary Examiner*—Charles A. Fox
(74) *Attorney, Agent, or Firm*—Sterne, Kessler, Goldstein & Fox, PLLC

(57) ABSTRACT

A substrate protection and transport system and method for transitioning a substrate from atmospheric pressure to vacuum in a lithography tool. The system includes one or more removable substrate transport cassettes that support a substrate. The cassette can include a base portion and top portion, and can include a seal. Each cassette has at least one vent and at least one filter. The system further includes a box having a base and lid. The box holds one or more cassette-substrate arrangements. A storage rack having shelves for holding the box-cassette-substrate arrangement is also provided. Further, an entry-exit module having a loadlock is provided for transitioning the cassette-substrate arrangement from atmospheric pressure to vacuum. The entry-exit module can include a shuttle and/or elevator for transporting the cassette-substrate arrangement. During transitioning, the filter(s) and vent(s) restrict particles within the loadlock from entering the cassette-substrate arrangement and reaching a surface of the substrate.

20 Claims, 26 Drawing Sheets

U.S. PATENT DOCUMENTS

| | | |
|---|---|---|
| 5,149,158 A | 9/1992 | Molinaro et al. |
| 5,390,785 A | 2/1995 | Garric et al. |
| 5,884,392 A | 3/1999 | Lafond |
| 6,090,176 A | 7/2000 | Yoshitake et al. |
| 6,239,863 B1 | 5/2001 | Catey et al. |
| 6,507,390 B1 | 1/2003 | Ivaldi |
| 6,612,797 B1 | 9/2003 | Bonora et al. |
| 6,619,903 B2 | 9/2003 | Friedman et al. |
| 2003/0031545 A1 | 2/2003 | DeMarco et al. |

* cited by examiner

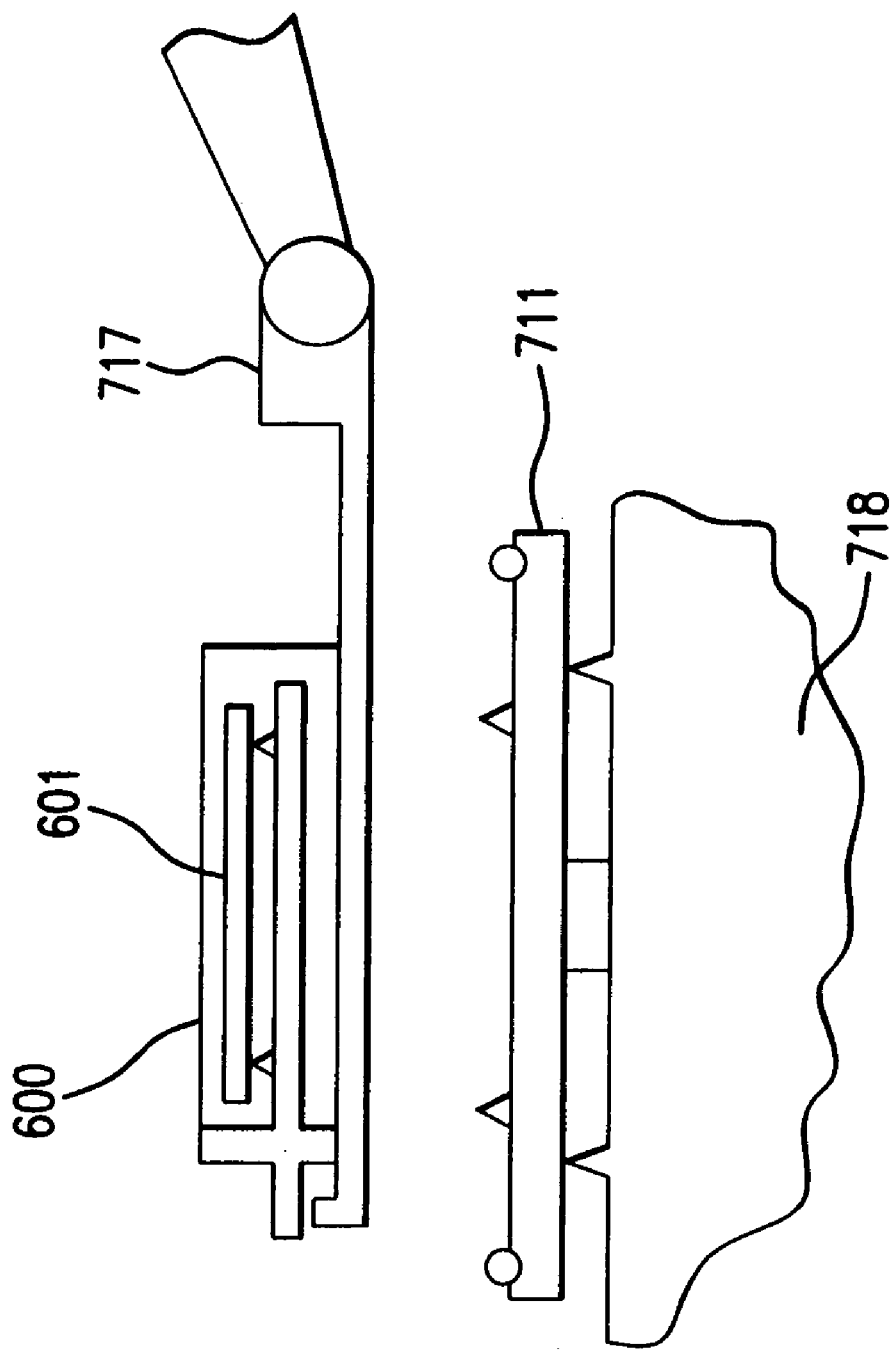

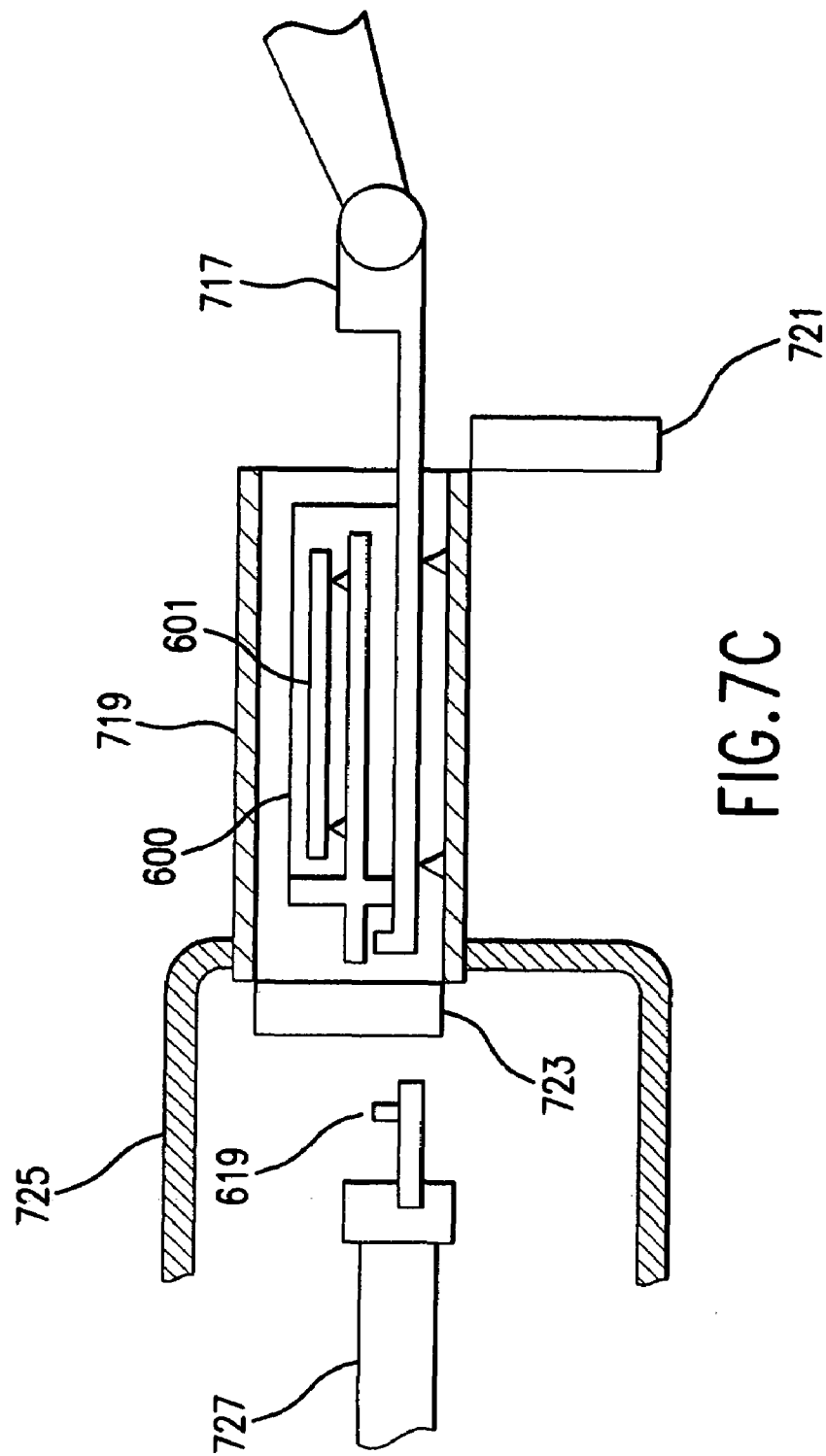

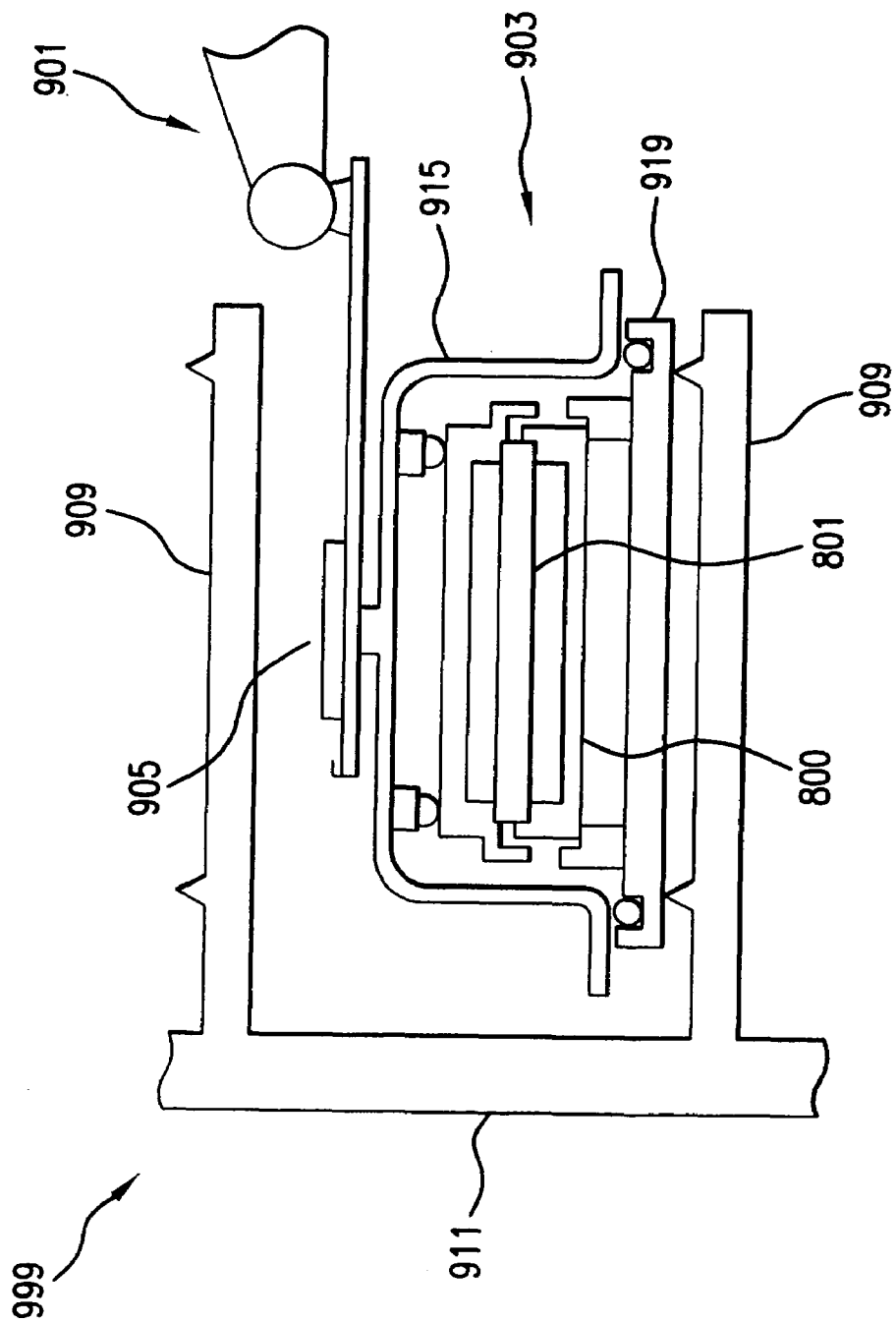

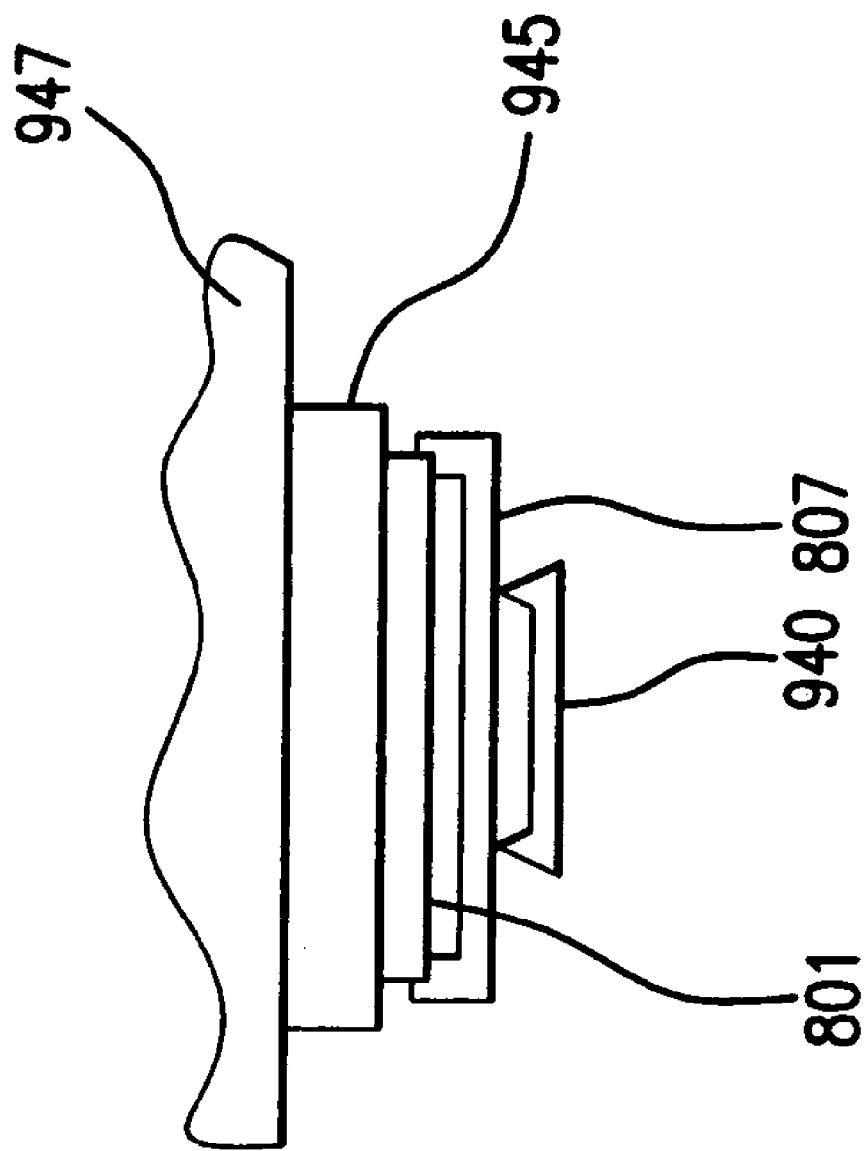

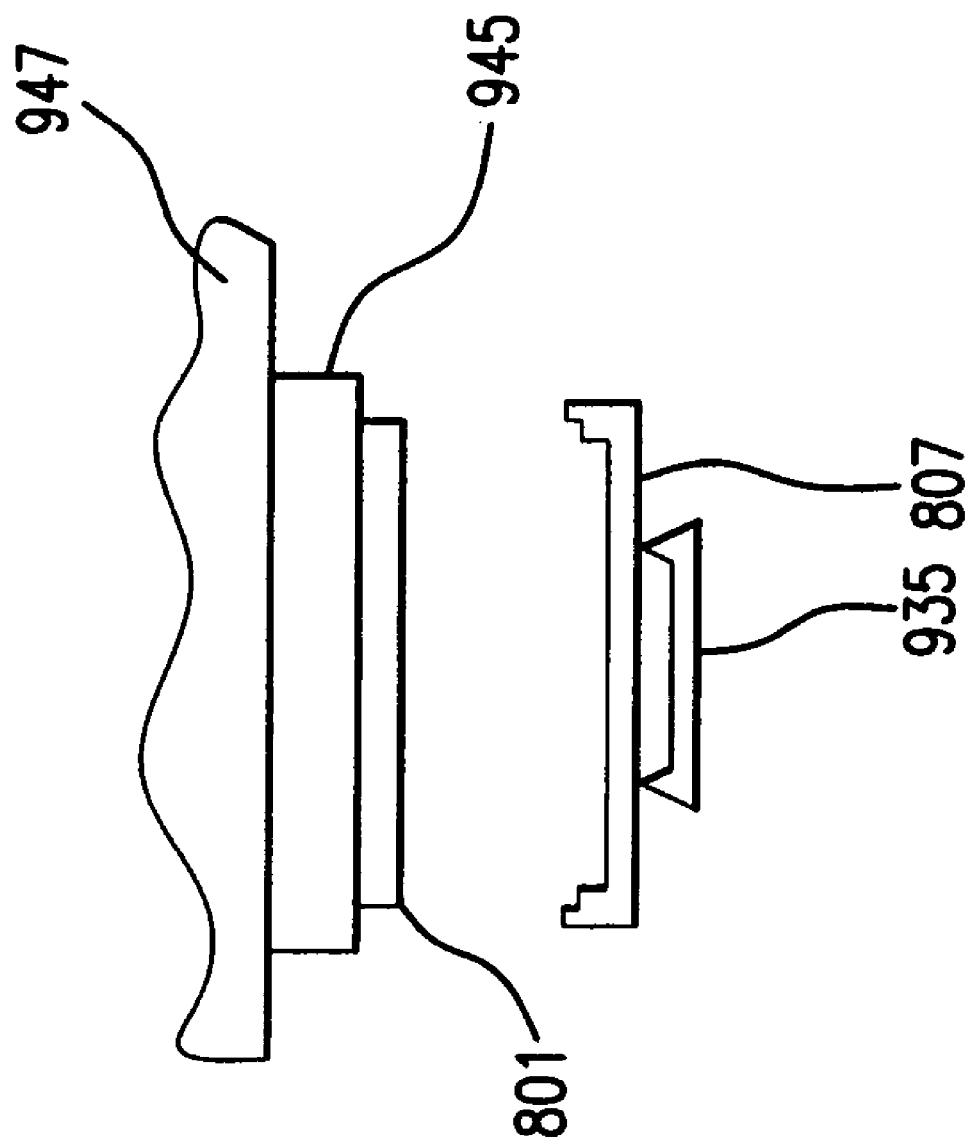

SYSTEM AND METHOD FOR RETICLE PROTECTION AND TRANSPORT

CROSS-REFERENCE TO RELATED APPLICATIONS

This application is a divisional of U.S. patent application Ser. No. 10/216,660, filed Aug. 12, 2002 (now U.S. Pat. No. 6,991,416 B2, issued Jan. 31, 2006), which is a continuation-in-part of U.S. patent application Ser. No. 09/925,722, filed Aug. 10, 2001 (now U.S. Pat. No. 6,619,903 B2, issued Sep. 16, 2003), both of which are incorporated herein by reference in their entireties.

BACKGROUND OF THE INVENTION

1. Field of the Invention

This invention relates generally to lithography, and more specifically to the protection of lithographic reticles.

2. Related Art

Lithography is a process used to create features on the surface of targets. Such targets can include substrates used in the manufacture of flat panel displays, circuit boards, various integrated circuits, and the like. A semiconductor wafer, for example, can be used as a substrate to fabricate an integrated circuit.

During lithography, a reticle, which is another exemplary substrate, is used to transfer a desired pattern onto the desired target. The reticle is formed of a material transparent to the lithographic wavelength being used. For example, in the case of visible light, the reticle would be formed of glass. The reticle has an image printed on it. The size of the reticle is chosen for the specific system in which it is used. During lithography, a wafer, which is supported by a wafer stage, is exposed to an image projected onto the surface of the wafer corresponding to the image printed on the reticle.

The projected image produces changes in the characteristics of a layer, for example photoresist, deposited on the surface of the wafer. These changes correspond to the features projected onto the wafer during exposure. After exposure, the layer can be etched to produce a patterned layer. The pattern corresponds to those features projected onto the wafer during exposure. This patterned layer is then used to remove exposed portions of underlying structural layers within the wafer, such as conductive, semiconductive, or insulative layers. This process is then repeated, together with other steps, until the desired features have been formed on the surface of the wafer. As should be clear from the above discussion, the accurate location and size of features produced through lithography is directly related to the precision and accuracy of the image projected onto the wafer.

In addition to the transmissive reticles just described, reflective reticles are also used in the art. For example, reflective reticles are used for short wavelength light that would otherwise be absorbed by a transmissive glass reticle.

In an effort to keep contamination of the reticle surface to a minimum, lithography processing is performed in a "clean room." A clean room is an enclosure having a specified controlled particle concentration. In order to maintain the specified controlled particle concentration, gaseous materials are provided to and removed from the enclosure. A considerable amount of expense is associated with maintaining a clean room. This expense is related, in part, to the size of the clean room and the equipment needed to maintain it. For example, as reticles are transported from one stage in a lithographic process to another, they are susceptible to contamination due to particles found within the processing area. To minimize the potential for contamination, the entire room in which the reticle is transported is usually maintained in a clean state. Thus, there is an incentive to reduce the environment that must be maintained in the clean state. A further incentive for reducing the size of the clean room is safety. In some cases, clean rooms are oxygen deficient and therefore unfit for human occupancy. If the clean room can be isolated to a smaller environment, then the surrounding area can be maintained for safe use and occupancy by humans.

In general, reticles arrive to and leave from lithography tools, including EUV lithography tools, in a closed box or "pod". Vibration, pressure shock, and turbulent air flow can result from opening the box and may stir up particles that are initially resting on the internal surfaces of the box, such as the top-side of the base or the inner walls and ceiling of the lid. Particles can become detached from the surfaces and then move freely and randomly within the gas volume inside the box. Some particles can eventually re-deposit on the exposed surfaces of an unprotected reticle within the box.

U.S. Pat. No. 6,239,863 (incorporated by reference herein in its entirety), issued to Catey et al., May 29, 2001, and commonly assigned to Silicon Valley Group, Inc., now ASML US, Inc., discloses a removable cover for protecting a reticle used in a lithography system. The removable cover includes a frame and a membrane supported by the frame. The removable cover can further include at least one reticle fastener that applies force to the reticle, thereby preventing movement of the removable cover relative to the reticle when the removable cover is in place. However, the use of the reticle fastener presents an opportunity for contamination from the contact between the reticle and the reticle fastener.

Reticles are typically stored in an atmospheric environment. In preparation for exposure, the reticles are transported from the atmospheric environment to a high vacuum environment. Of prime concern in EUV lithography, is how to transition reticles from the atmospheric pressure environment to the high vacuum environment without adding particles to critical areas of the reticle henceforth, the "reticle pattern" or the "patterned areas" during transient confusion. Transient confusion refers to the stirring up of the particles in the loadlock of the EUV lithography tool by the turbulent air currents resulting from having to remove the air from the loadlock. This is a new problem in the context of lithography tools, since the EUV tool is the first tool to expose the reticle in vacuum and without a protective pellicle.

A similar problem has been encountered before by those who design the tools that write masks, henceforth "mask writer tools". Mask writer tools use one or more electron beams to write mask blanks directly from the design data, a few pixels at a time, which takes a long time (as opposed to copying a pattern from the mask to the wafer in one quick pass with light as lithography tools do). Electron beams in mask writers have always required the reticle to be exposed in high vacuum and have precluded the use of pellicles, similarly to EUV light in lithography.

In the paper titled "New Mask Blank Handling System for the Advanced Electron Beam Writer" (published in the proceedings of the 19th Annual BACUS Symposium on Photomask Technology, September 1999, SPIE Vol. 3873, ref # 0277-786/99) Yoshitake et al. describe their solution to the problem. In summary, Yoshitake found that if during the transition between atmospheric pressure and vacuum, the mask blank is maintained inside a box having membrane filters (the Clean Filter Pod or CFP), many fewer particles tend to settle on the mask blank. Hence, Yoshitake's solution was to put the mask blank inside a permeable-to-gas-only box, place the box inside the loadlock, transition the loadlock between atmospheric pressure and vacuum, open the box, and remove the mask blank from the box and the loadlock.

The Yoshitake solution, however, introduces additional problems to be solved. First, in the example where the masks are contained in a closed box or pod, the masks are unprotected. Consequently, there is a potential for contamination of the masks when the closed box or pod is opened. Second, in the example where the masks are contained in a box having filters, the same device is used to remove the mask blanks from the box. This creates the potential for cross-contamination.

Briefly stated, there is a need for a way of further reducing the potential for reticle contamination during transport. Likewise, there is also a need to reduce the potential for reticle contamination while it is transitioning between atmospheric pressure and vacuum.

BRIEF SUMMARY OF THE INVENTION

The present invention provides a substrate protection and transport system and method for transitioning a substrate from atmospheric pressure to vacuum in a lithography tool. The system includes one or more removable substrate transport cassettes that support a substrate, forming one or more cassette-substrate arrangements. In an embodiment, the removable substrate transport cassette includes a base portion and a top portion, and can also include a seal. Each cassette can also include an edge band that can provide a surface to support the top portion of the removable substrate transport cassette. Each cassette has at least one vent and at least one filter. The system further includes a box having a base and a lid. The box holds one or more of the cassette-substrate arrangements, forming a box-cassette-substrate arrangement. A storage rack having shelves for holding the box-cassette-substrate arrangement is also provided. Further, an entry-exit module having a loadlock is provided for transitioning the cassette-substrate arrangement from atmospheric pressure to vacuum. The entry-exit module can include an atmospheric de-podder to detach the box base from the box lid. The entry-exit module can also include a shuttle for transporting the cassette-substrate arrangement, and can further include an elevator. During transitioning, the filter(s) and vent(s) restrict particles within the loadlock from entering the cassette-substrate arrangement and reaching a surface of the substrate.

The method for transitioning a substrate from atmospheric pressure to vacuum includes loading the substrate into a removable substrate transport cassette to produce a cassette-substrate arrangement and loading the cassette-substrate arrangement into a box to produce a box-cassette-substrate arrangement. The method also includes transporting the box-cassette-substrate arrangement to a shelf of a first storage rack and transporting the box-cassette-substrate arrangement out of vacuum from the first storage rack to an entry-exit module. The method further includes unlatching a lid of the box from a base of the box and lowering the base on an elevator, the base supporting the cassette-substrate arrangement. The method also includes engaging the cassette-substrate arrangement with a shuttle, using the shuttle to transport the cassette-substrate arrangement into a loadlock, an transitioning the loadlock from atmospheric pressure to vacuum. At least one vent and at least one filter of the cassette-substrate arrangement restrict particles within the loadlock from entering the cassette-substrate arrangement and reaching a surface of the substrate.

These and other advantages and features will become readily apparent in view of the following detailed description of the invention.

BRIEF DESCRIPTION OF THE DRAWINGS/FIGURES

The present invention is described with reference to the accompanying drawings. In the drawings, like reference numbers indicate identical or functionally similar elements. Additionally, the left-most digit of a reference number identifies the drawing in which the reference number first appears.

FIGS. 7A-7H, show simplified side views of an embodiment of a substrate transport system and other portions of a lithography tool in accordance with an embodiment of the present invention.

FIGS. 9A-9K show simplified side views of an embodiment of a substrate transport system and other portions of the lithography tool in accordance with an embodiment of the present invention.

DETAILED DESCRIPTION OF THE INVENTION

Embodiments of the present invention will now be discussed in detail. While specific features, configurations and arrangements are discussed, it should be understood that this is done for illustration purposes only. A person skilled in the relevant art will recognize that other steps, configurations and arrangements or devices may be used to achieve the features of the invention without departing from the spirit and scope thereof. Indeed, for the sake of brevity, conventional electronics, manufacturing of semiconductor devices, and other functional aspects of the method/apparatus (and components of the individual operating components of the apparatus) may not be described in detail herein.

Figure 1:
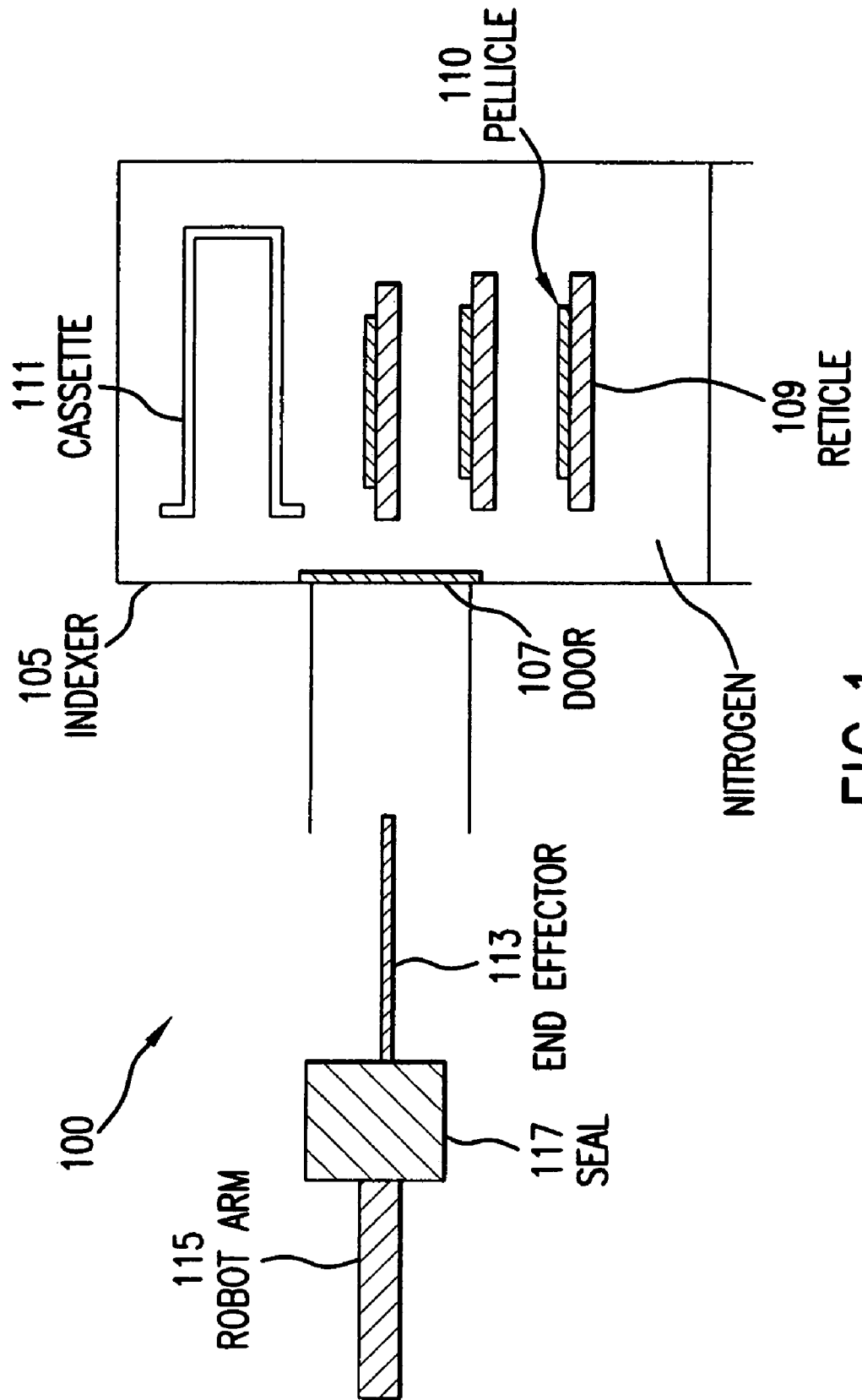
FIG. 1 is an illustration of a reticle transport system in accordance with an embodiment of the present invention.

FIG. 1 illustrates a reticle transport system 100 for a lithography tool. The reticle transport system 100 includes an indexer 105. In accordance with an embodiment of the present invention, the indexer 105 further comprises a library of shelves (not shown) within the lithography tool. An inert gas atmosphere is maintained within the indexer 105. According to an embodiment, for example, the indexer 105 is filled with nitrogen gas and other gaseous materials necessary to meet the clean room requirements.

A plurality of reticles 109 are stored on shelves (not shown) within the indexer 105. Reticles are used to transfer a particular pattern onto a substrate such as a semiconductor wafer, a panel display, a circuit board, and the like. The reticle can be of the reflective or transmissive type, as would be apparent to a person skilled in the lithography art. To protect the reticle 109 from contamination, a pellicle 110 may be fixed over the reticle 109. An example of a pellicle that can be used in connection with the present invention is described in commonly owned, co-pending U.S. non-provisional patent application Ser. No. 09/501,180, filed Feb. 10, 2000 (now U.S. Pat. No. 6,507,390 B1, issued Jan. 14, 2003), titled "Method and Apparatus for a Reticle with Purged Pellicle-to-Reticle Gap," which is incorporated herein by reference.

Although the reticles in FIG. 1 are positioned vertically to each other, this presentation is for example only and not limitation. In alternative embodiments, the reticles could also be stored horizontally to one another. Likewise, in another embodiment, the reticles could be stored on a carousel and the reticles rotated to a particular position within the indexer. In an embodiment, the reticle 109 and pellicle 110 are stored upside down. In this way, any contaminants falling on the reticle will be on the backside. If the reticle 109 and pellicle 110 are stored upright (as depicted in FIG. 1) then the end effector 113 could be made to rotate the reticle and pellicle upside down. After reading this disclosure, a person skilled in the relevant art(s) will recognize other arrangements for storing reticles 109 and pellicles 110 within the indexer 105, without departing from the scope of the present invention.

A removable reticle cassette 111 is also stored within the indexer 105. The removable reticle cassette 111 is used to house the reticle 109 during transport. The environment of the removable reticle cassette 111 is also maintained in a "clean" state. In this way, the clean room state is maintained in a much smaller volume of space. Although the indexer 105 is shown containing only one removable reticle cassette 111, this is for example only, and is not intended to limit the present invention. The number of removable reticle cassettes 111 and likewise, the number of stored reticles 109 are determined by the space constraints of the indexer 105. The present invention is described with reference to a reticle, having a pellicle attached thereto. However, this is for example only, and not limitation. Reticles, without a pellicle, can be used without departing from the scope and spirit of the present invention. Further details of the removable reticle cassette 111 will be provided below with respect to FIG. 2.

The reticle transport system 100 further comprises an end effector 113, coupled to a robotic arm 115. The end effector 113 engages one of the plurality of reticles 109 and pellicle 110 in order to position the reticle 109 and pellicle 110 within the removable reticle cassette 111. In alternative embodiments, a wand or other manual or robotic device capable of engaging the reticle or pellicle (if present) may also be used. In an embodiment, the end effector 113 engages the reticle 109 and pellicle 110 through electrostatic attraction. In alternative embodiments, the end effector 113 could engage the reticle 109 and pellicle 110 through vacuum attraction.

A seal 117 is also used in the reticle transport system 100. The seal 117 is used to secure the reticle within the removable reticle cassette 111. The seal 117 can be any device capable of securing the reticle 109 within the removable reticle cassette 111 while at the same time, preventing contaminants from entering into the removable reticle cassette and nitrogen from escaping the removable reticle cassette 111. For example, the seal 117 could be a vacuum seal or a magnetic seal. Accordingly, a vacuum system, a magnetic system, or the like, can also be used in connection with the present invention to facilitate the sealing function.

The reticle transport system 100 further comprises a door 107. The door 107 is used to keep the contaminants from coming into the indexer 105 and the nitrogen gas from seeping out. In alternative embodiments, indexer 105 may be provided with more than one door 107. For example, additional doors may be used to provide access to the indexer 105 for manual or automatic loading of the plurality of reticles 109 and the removable reticle cassette 111. Foreseeable reasons for accessing the indexer 105 might also include repair of the indexer 105, replacement of the reticles 109, or the like. Still further, the end effector 113 could be made to pass through one or more doors 107 before engaging the reticle 109.

Figure 2:
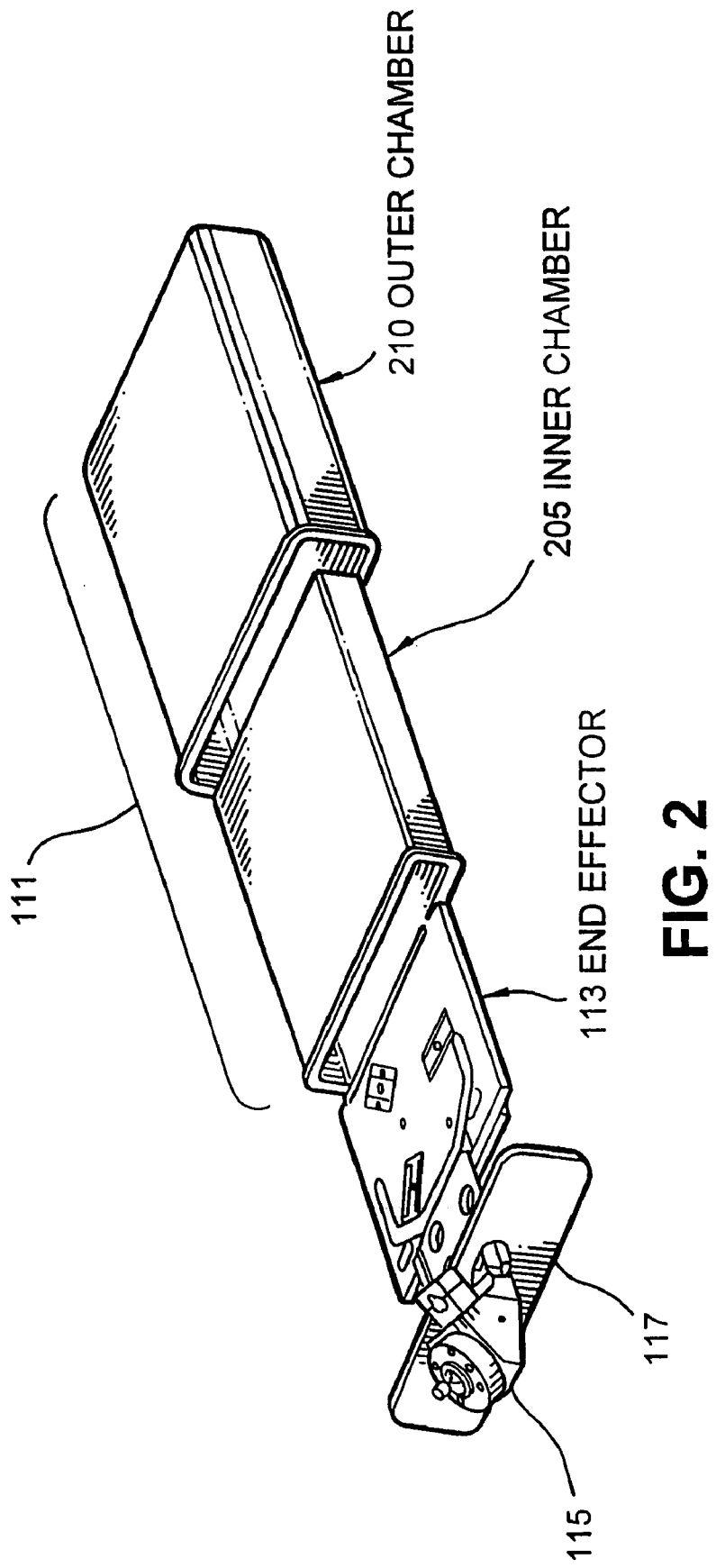
FIG. 2 is an illustration of a removable reticle cassette according to an embodiment of the present invention.

FIG. 2 provides a perspective view of an exemplary removable reticle cassette 111 in accordance with an embodiment of the present invention. In this embodiment, the removable reticle cassette 111 comprises an inner chamber 205 and an outer chamber 210. The inner chamber 205 carries the reticle 109 and the pellicle 110. The inner chamber 205 is sealed within the outer chamber 210 by the seal 117 during reticle exchanges. The outer chamber 210 is used to contain the nitrogen gas and other gaseous materials necessary to provide the clean state environment.

The material used for the removable reticle cassette 111 should be compatible with standard cleaning agents used with lithography systems. The materials should not result in the production of outgassing of amines, or other undesirable substances harmful to the lithographic process. Still further, the material should be resistant to mechanical degradation. Examples of possible materials that could be used include fiber reinforced molded polymers, Derlin (trademark) or PTFE (Teflon (trademark)) coated metals such as aluminum or titanium. Other materials may be used without departing from the scope of the present invention.

In accordance with embodiments of the present invention, the removable reticle cassette 111 accommodates reticles with any type of pellicle and reticles without a pellicle. Furthermore, the removable reticle cassette 111 also accommodates solid or breathable pellicle frames.

Figure 3:
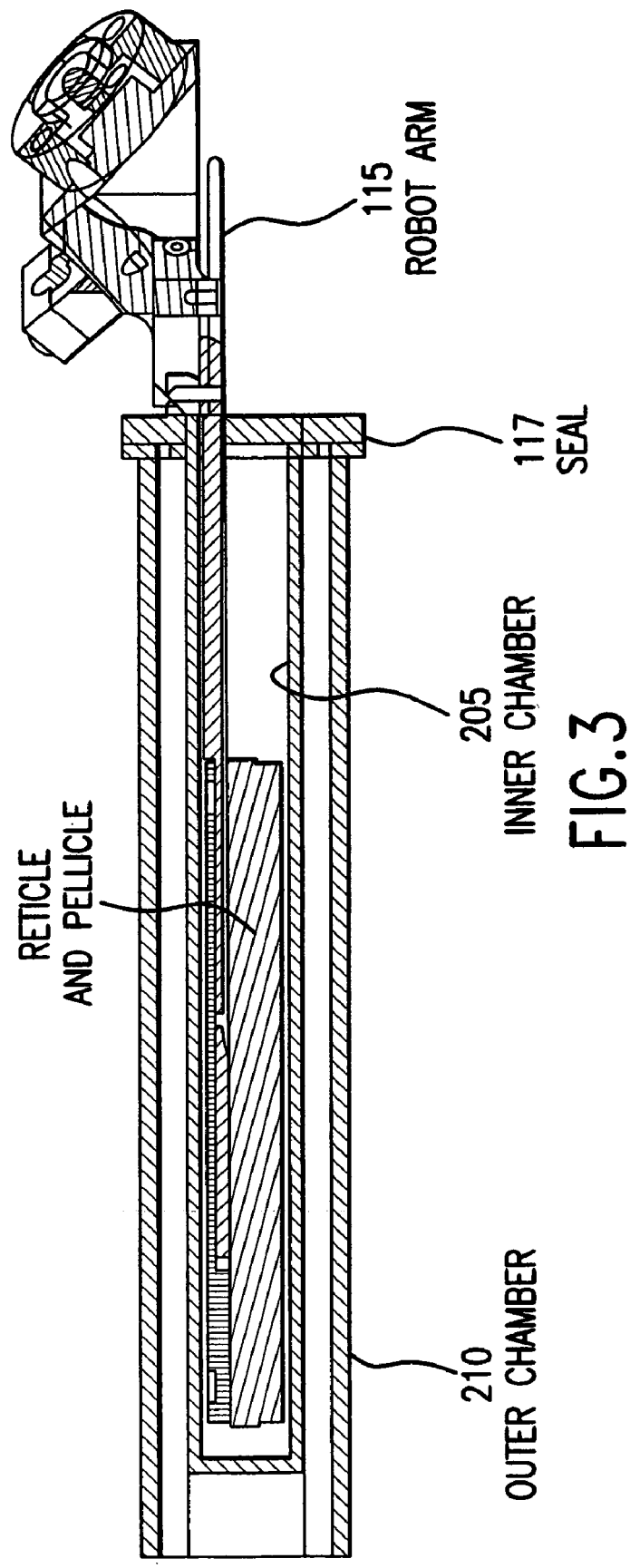
FIG. 3 is an illustration of an arrangement of a reticle and pellicle within a removable reticle cassette according to an embodiment of the present invention.

FIG. 3 provides an illustration of the arrangement of a reticle 109 and pellicle 110 sealed within the removable reticle cassette 111, which is ready for transport by the robot arm 115, in accordance with an embodiment of the present invention. The end effector 113 is shown engaging a reticle and pellicle. In alternative embodiments, a wand or other mechanical, electromechanical, or robotic device capable of engaging the reticle or pellicle may also be used. After reading this disclosure, additional engaging means will be apparent to a person skilled in the relevant art(s). A method for transporting a reticle 109 from the indexer 105 will now be described with respect to FIGS. 4 and 5.

Figure 4:
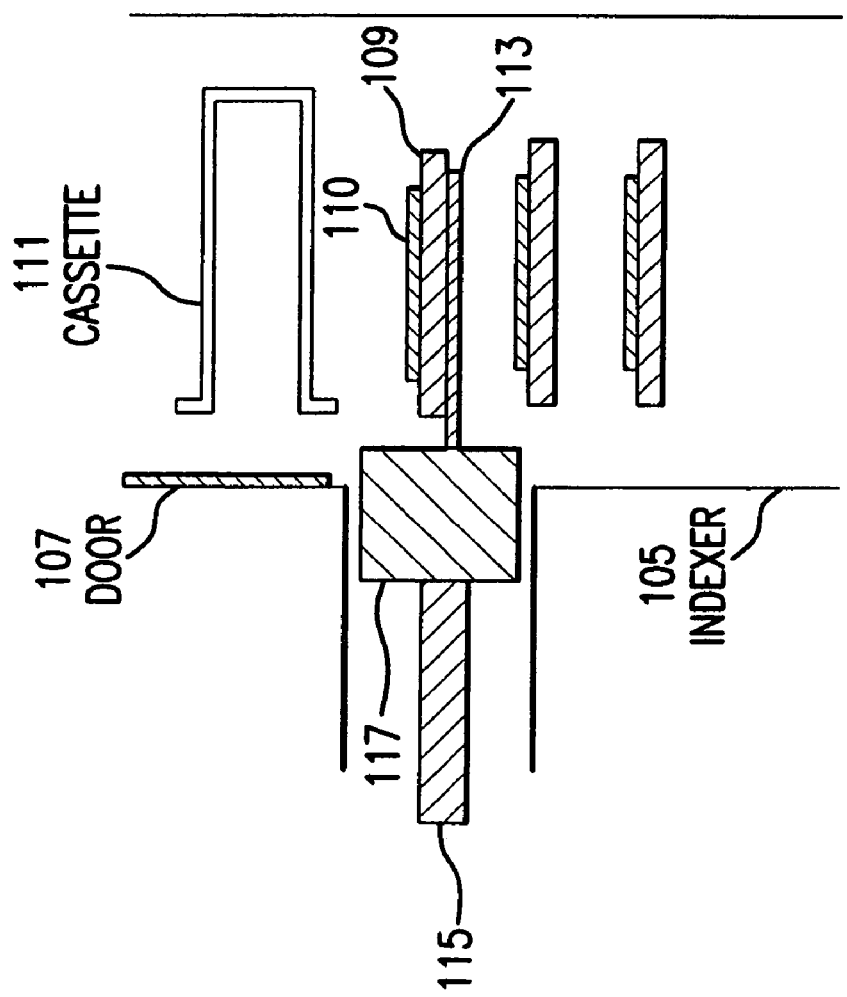
FIGS. 4 and 5 are illustrations of a method of loading a reticle into a removable reticle cassette according to an embodiment of the present invention.

Referring to FIG. 4, a method of transporting a reticle 109 from the indexer 105 in a lithography system begins with the opening of the door 107 to allow the end effector 113 to gain access to the contents of the indexer 105.

Next, the reticle 109 and pellicle 110 are engaged by the end effector 113. In accordance with embodiments of the present invention, the end effector 113 can engage the reticle 109 and pellicle 110 by means of a vacuum, electrostatic charge, magnet, wand, or other lifting devices. Once the reticle 109 and pellicle 110 are fixed to the end effector 113, the robot arm 115 is used to maneuver the end effector 113 toward the removable reticle cassette 111. In an embodiment, the reticle 109 and pellicle 110 would be oriented so that they are upside down. In this way, any potential contamination would be on the backside of the reticle.

Figure 5:
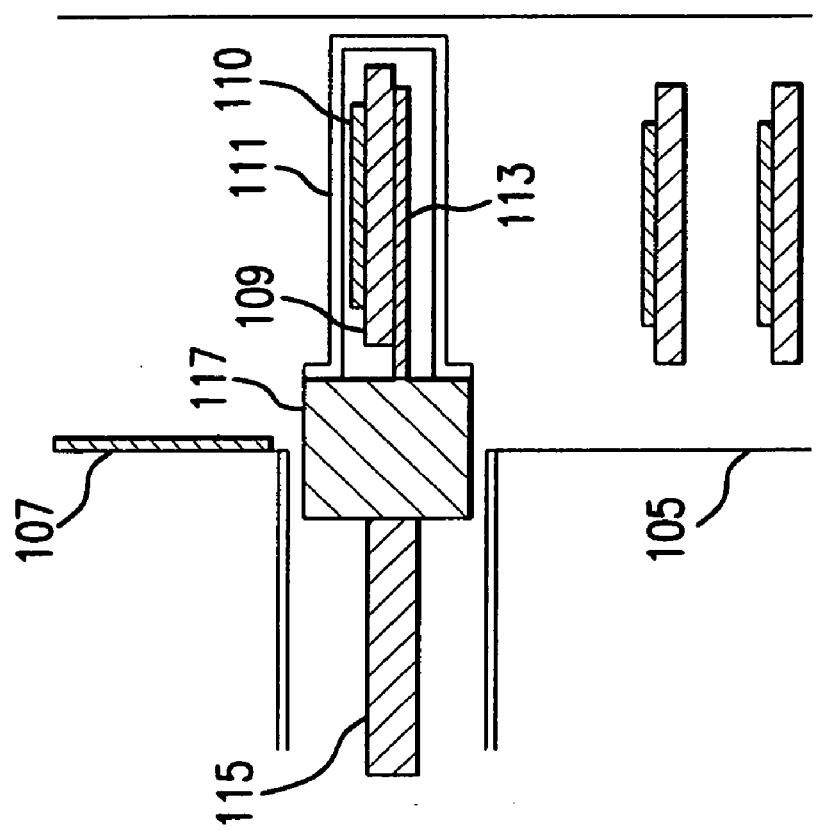

FIG. 5 depicts the reticle 109 and pellicle 110 being loaded into the removable reticle cassette 111, such that the removable reticle cassette 111 does not come into contact with the reticle 109 and pellicle 110. Once the reticle 109 and pellicle 110 are placed within the removable reticle cassette 111, the seal 117 is used to secure the clean environment, thereby producing a sealed arrangement.

Finally, the robot arm 115 is used to transport the sealed arrangement from the indexer 105 to a mount for performing lithographic exposure. Once the lithographic exposure process is completed, in accordance with embodiments of the present invention, the sealed arrangement is returned to the indexer 105. The reticle 109 and pellicle 110 are then removed from the removable reticle cassette 111 through reversal of the process described in FIGS. 4 and 5.

As mentioned above, how to transition reticles from an atmospheric pressure environment to a high vacuum environment, without adding particles to critical areas of the reticle, is of prime concern in EUV lithography. Accordingly, exemplary systems and methods for a substrate transport system for use in transitioning reticles in an EUV lithography tool in accordance with embodiments of the present invention will now be described.

The term substrate is used in some of the exemplary embodiments described herein. In other exemplary embodiments reference is made to a reticle. It will be apparent to persons of ordinary skill in the art after, reading the disclosures herein, that substrates other than reticles, for example, mask blanks, wafers, flat panel displays, and the like can be used. Such equivalent substrates are considered to be within the scope of the present invention.

Figure 6:
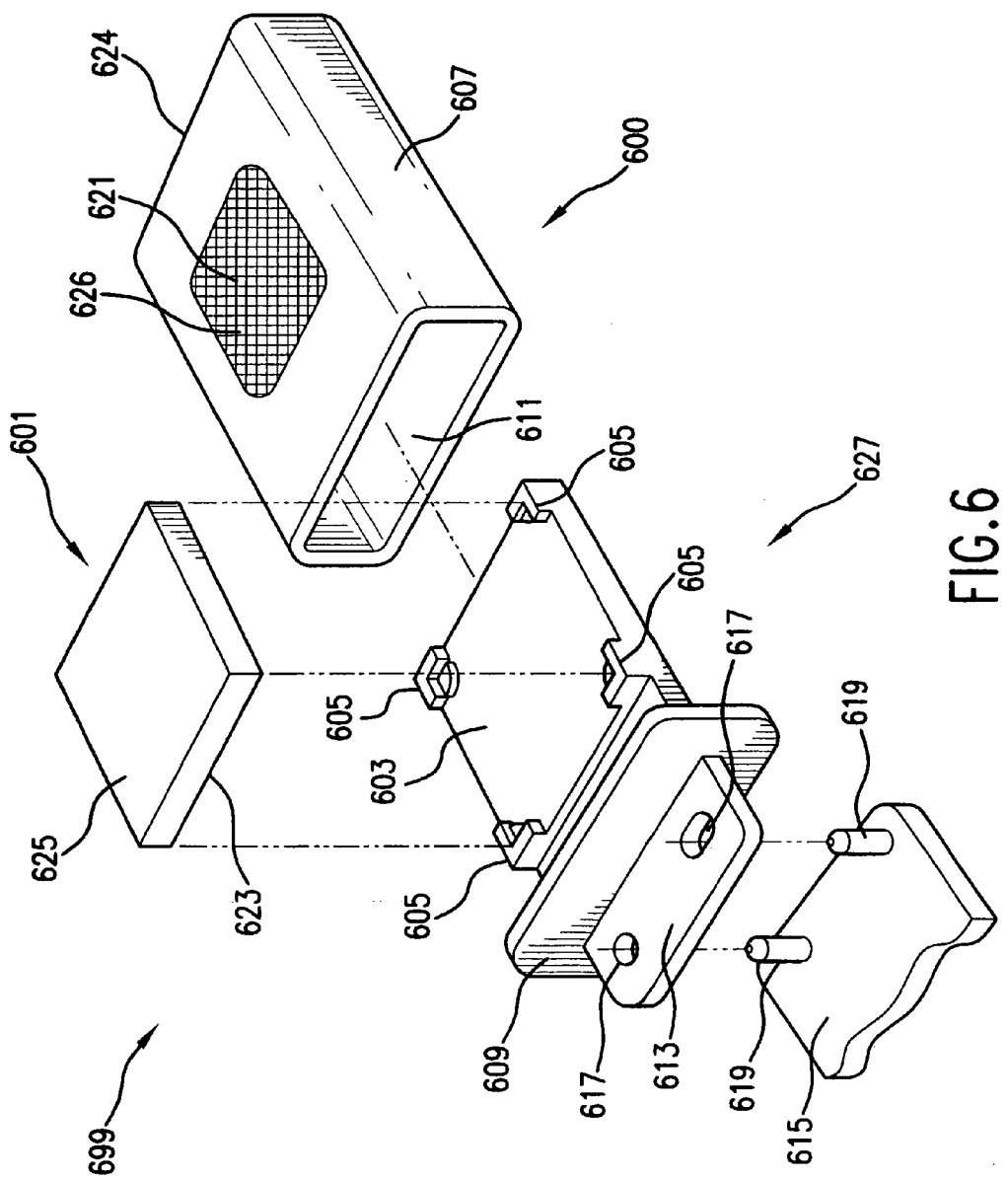
FIG. 6 is an illustration of a substrate transport system in accordance with an embodiment of the present invention.

An exemplary substrate transport system 699 will now be described with reference to FIGS. 6 and 7A-7H. An exploded view of removable substrate transport cassette 600 comprising shell 607 is shown in FIG. 6. In an embodiment, substrate 601 fits horizontally in tray 603. The four bottom corners of the substrate 601 engage tray locators 605. Tray 603 and substrate 601 fit inside shell 607 through opening 611. Opposite end 624 of shell 607 is a closed end. With tray 603 positioned inside shell 607, flange 609 seals opening 611 with a latching means (not shown), substantially preventing the flow of gas and particles through said opening. Latching means can comprise, for example, permanent magnets, electromagnets, mechanical latches, passive hooks and eyes, and the like. Additional means for sealing flange 609 to opening 611 would be apparent to persons skilled in the relevant arts based on the teachings described herein. The arrangement of the substrate 601 within the removable substrate transport cassette 600 is referred to herein as a cassette-substrate arrangement.

In an embodiment, shell 607 is further provided with one or more filters 621 and vents 626. Preferably, gas, but not particles, can flow through filters 621 and vents 626. In an embodiment, one filter 621 and vent 626 is located opposite to a patterned side 623 of the substrate 601. In FIG. 6, consistently with actual orientation in an EUV tool, the patterned side 623 faces downward towards tray 603. Therefore a blank side 625 of the substrate 601 faces upwards, towards filter 621 and vent 626. Even though the filters and vents do not allow through flow of particles, contaminant particles, which may initially be attached to the inner side of the filters 621, may become dislodged when gas flows from the exterior to the interior of the removable substrate transport cassette 600 during a pressure transition (i.e. venting). Due to the orientation of the substrate 601, the dislodged particles are more likely to impinge on substrate's 601 blank side 625 than on its patterned side 623. Thus, by favorably locating at least one filter 621 relative to the patterned side of the substrate 601, the pattern can be kept more particle-free.

In an embodiment, substrate transport system 699 is further comprised of a substrate transporter 627. Using an end effector 615, a vacuum-compatible manipulator or motion device henceforth "vacuum robot" (not shown), can hold and transfer substrate 601 within substrate transporter 627 from station to station within a lithography tool. Further descriptions of this process are provided below with respect to FIGS. 7A-7H.

Continuing with the present description, the end effector 615 is provided with at least one end effector locator 619. To facilitate holding of the substrate transporter 627, an engaging tab 613 is coupled to flange 609. The engaging tab is provided with tab locators 617. In this way, end effector locators 619 of the end effector 615 can respectively engage tab locators 617 of engaging tab 613. The end effector locators 619 and engaging tab locators 617 pairs can comprise pins in holes, pins in slots and the like. When shell 607 is attached to flange 609, vacuum robot can use the end effector 615 and engaging tab 613 to move the reticle transporter 627, shell 607, and the enclosed substrate 601 from station to station within the process chamber of the lithography tool. Additional embodiments of substrate transport system 699 will now be described with reference to FIGS. 7A-7C and 7F-7G.

Figure 7A:
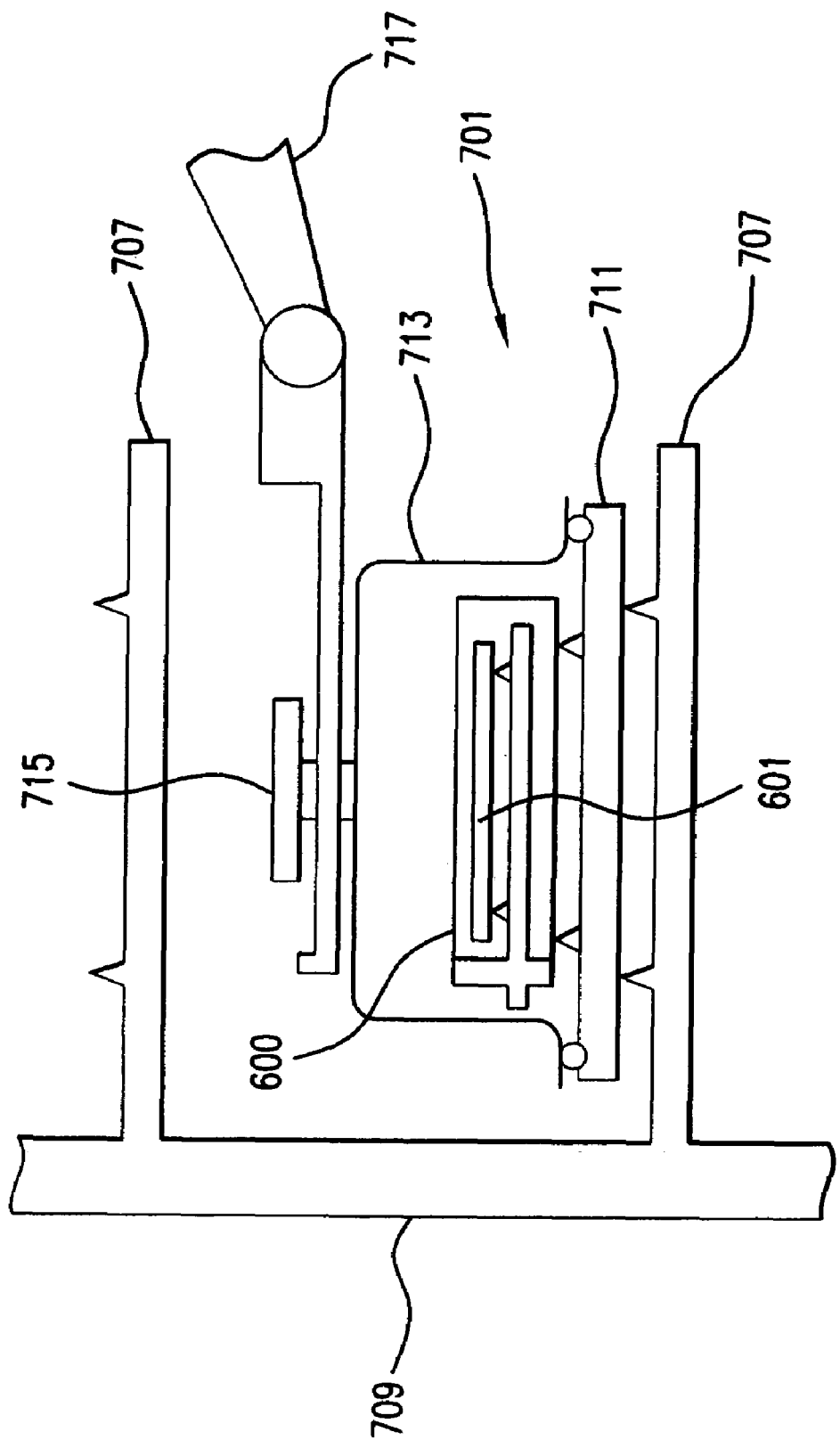

Referring to FIG. 7A, in an embodiment of the present invention, substrate transport system 699 is further comprised of a box 701. Box 701 is used to contain the cassette-substrate arrangement. A popular type of box is the "Standard Mechanical Interface (SMIF) reticle pod". Henceforth, however, "box" will be used generically to describe any airtight container having a substantially planar base 711 and a detachable lid 713 in which the substrate 601 is transported from machine to machine. A handle 715 coupled to lid 713 enables a manipulator or motion device, henceforth "atmospheric robot" 717 to pick up box 701 by handle 715. Latching means (not shown) keep the base 711 and the lid 713 temporarily coupled. A seal (not shown) between the base 711 and the lid 713 prevents gas and particles from flowing in and out of the box 701.

In an embodiment of the present invention the substrates 601 and the removable substrate transport cassettes 600 would be stored and transported inside the box 701. The arrangement of the cassette-substrate arrangement inside the box is referred to herein as a box-cassette-substrate arrangement. Each substrate 601 would be inside its own removable substrate transport cassette 600, which in turn would be inside the box 701. For simplicity and clarity, the descriptions herein are limited to boxes that hold only one substrate, such as substrate 601, for example, but it will be immediately apparent that boxes holding a plurality of substrates can also be handled by the present invention. For example one type of SMIF reticle pod presently in use can hold up to six reticles. In an embodiment of the present invention, the box 701 is temporarily placed on a shelf 707 of a first storage rack 709. In an embodiment, the first storage rack 709 is an "out of vacuum (OOV) rack".

Referring to FIG. 7B, in accordance with an embodiment of the present invention, substrate transport system 699 is further comprised of a detacher 718. Detacher 718 is capable of detaching the base 711 from the lid 713. Exemplary detachers include a "de-podding station", and a manual SMIF de-podding station, also known as a "pod popper".

Referring to FIG. 7C, in an embodiment of the present invention, the substrate transport system 699 is further comprised of a loadlock 719. The loadlock 719 includes atmospheric-side door 721 and vacuum-side door 723, which couples the loadlock 719 to a process chamber 725. The vacuum-side door 723 is provided to enable a vacuum compatible transfer mechanism, henceforth "vacuum robot" 727 access into loadlock 719. The vacuum robot 727 is able to couple itself to removable substrate transport cassette 600 using locator pairs 617 (not shown) and 619.

Figure 7D:
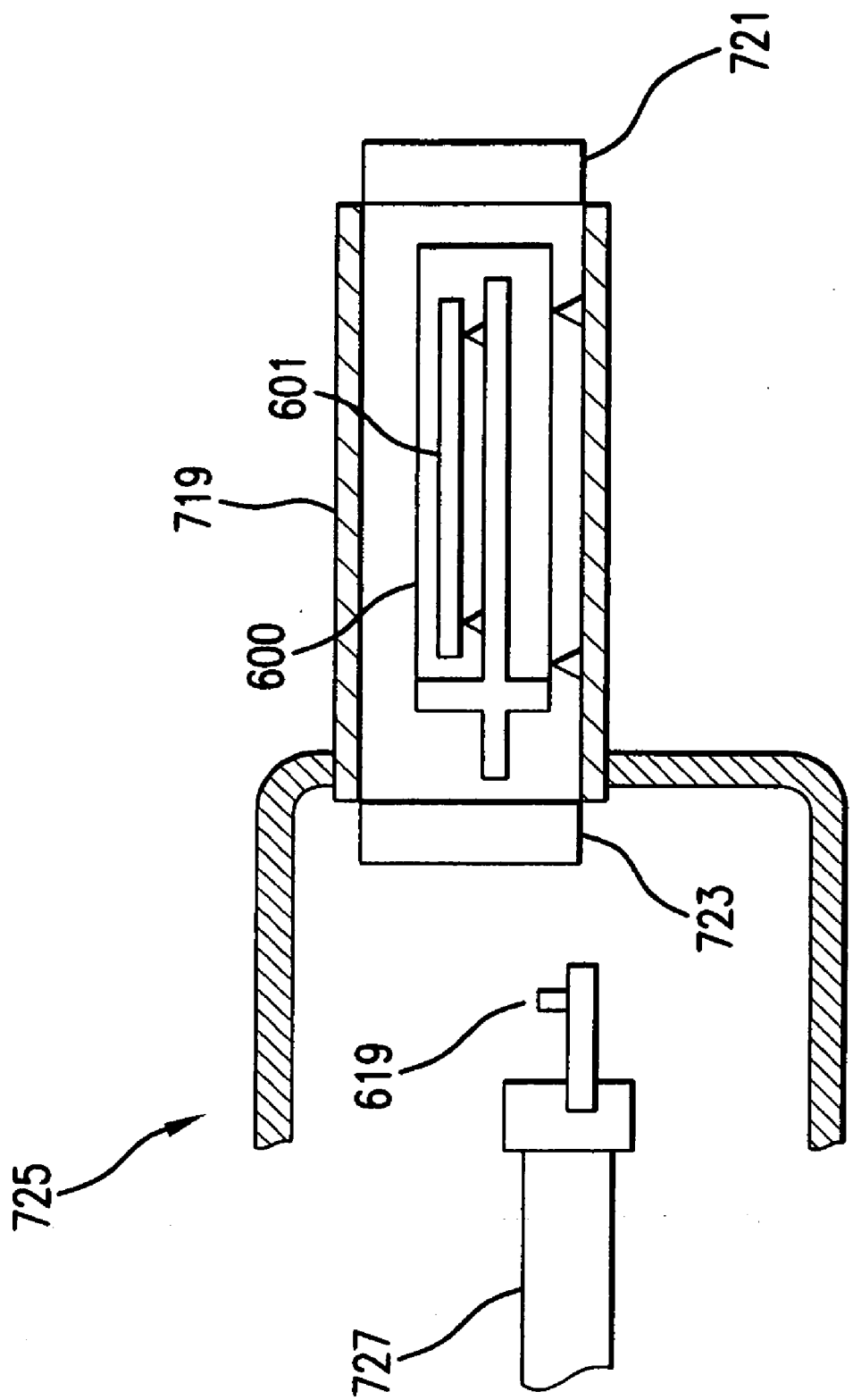
Figure 7E:
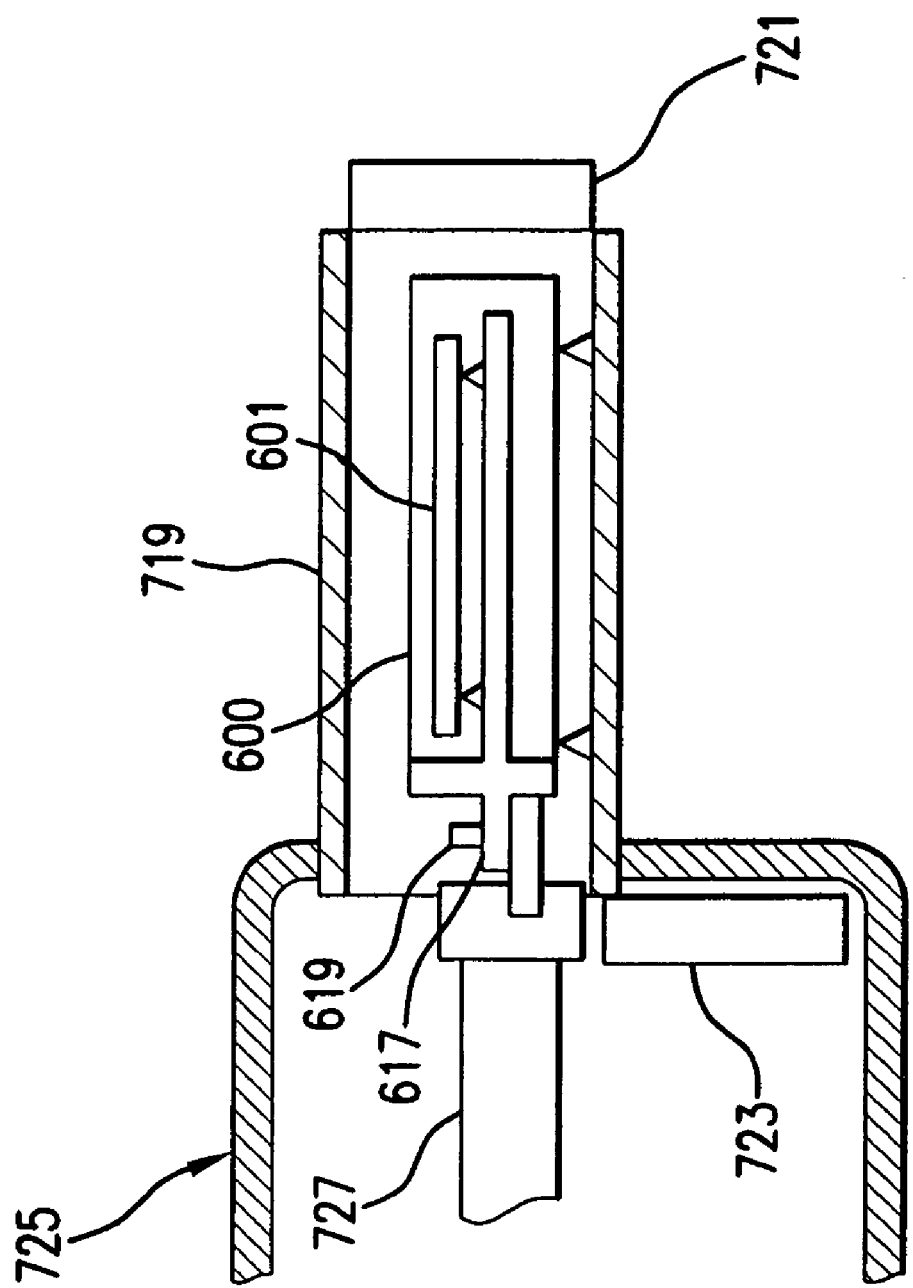
Figure 7F:
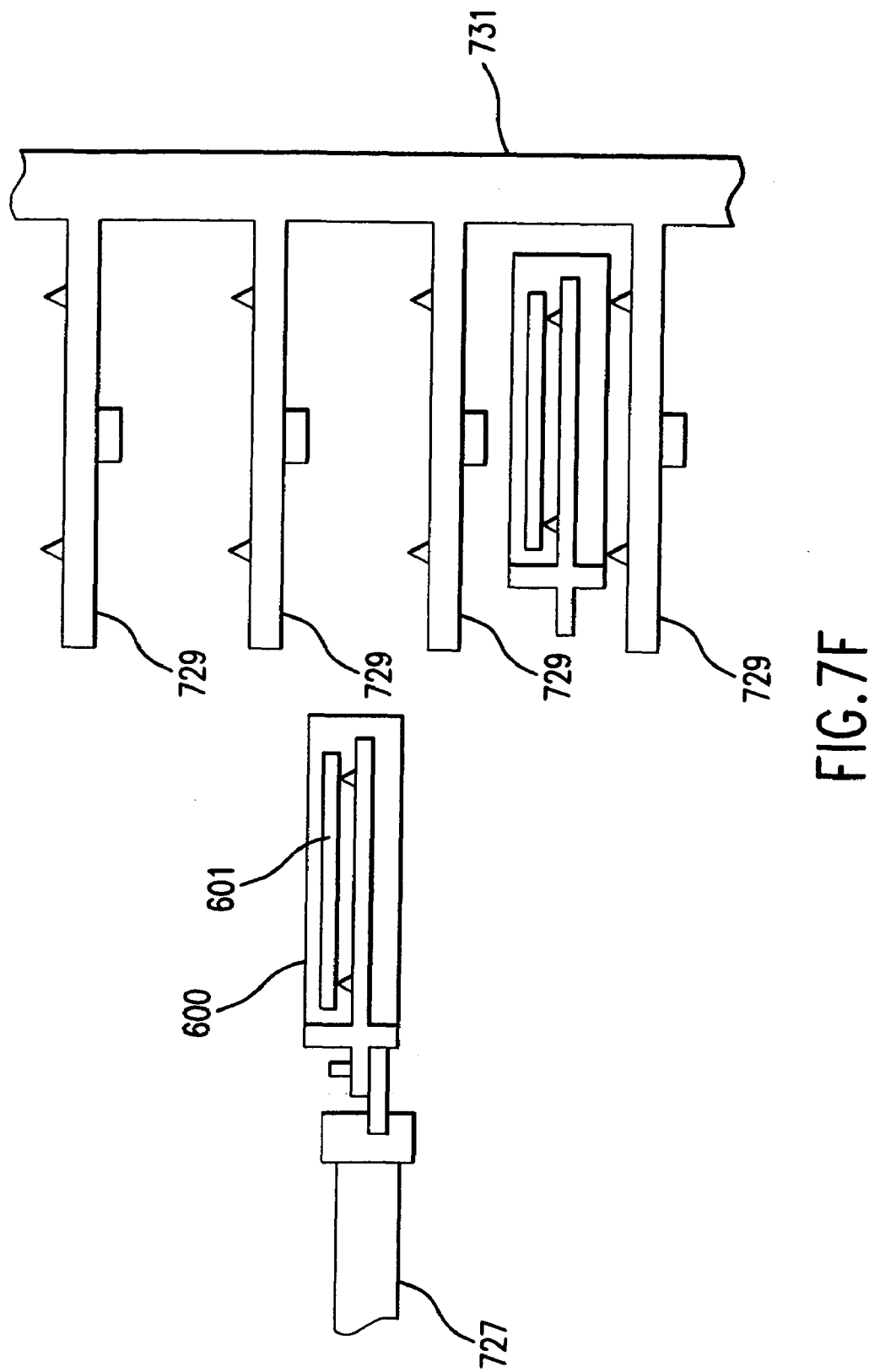

Referring to FIG. 7F, in an embodiment of the present invention, substrate transport system 699 is further provided with a second storage rack 731 located within process chamber 725. The second storage rack 731 has a plurality of shelves 729 for storing the removable substrate cassette 600 and substrate 601 (i.e., cassette-substrate arrangement). An exemplary second storage rack is an in-vacuum (IV) library.

Figure 7G:
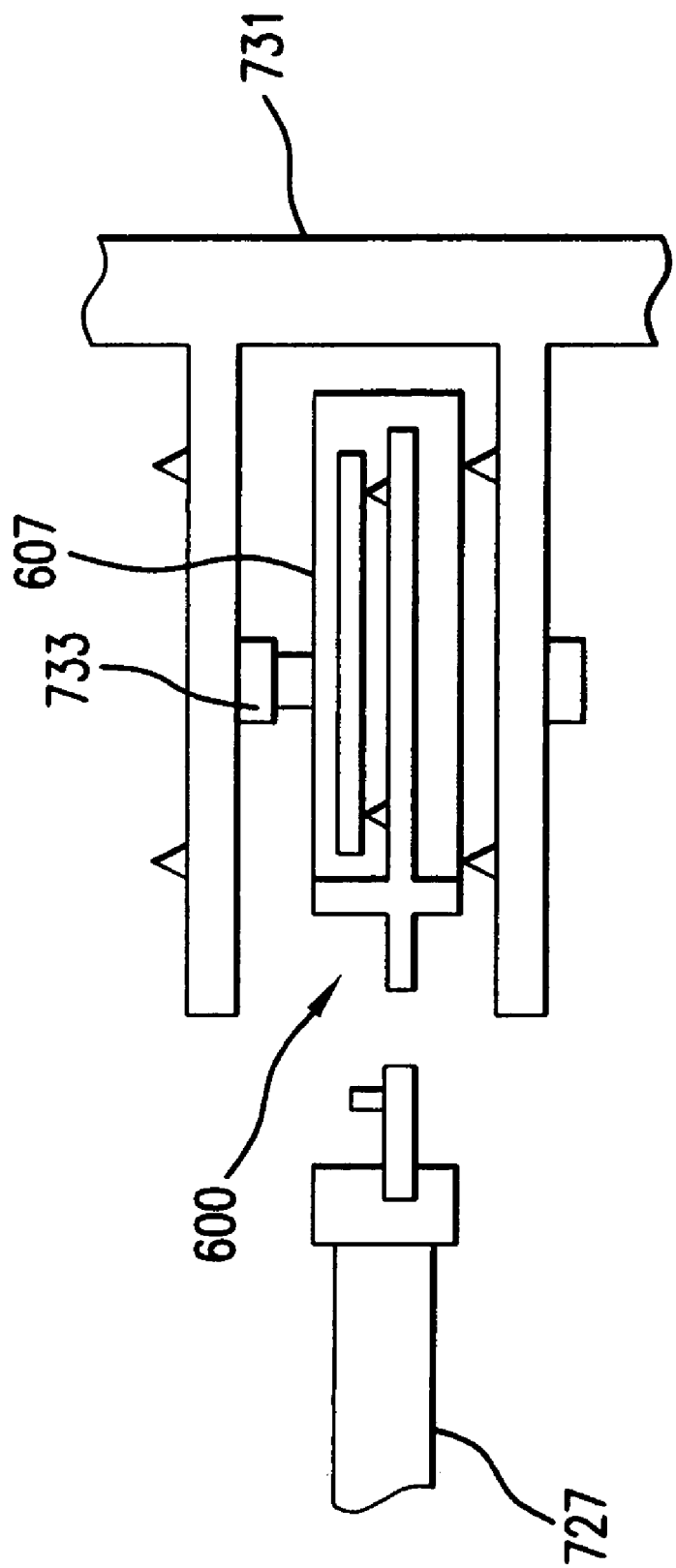

Referring to FIG. 7G, in yet another embodiment of the present invention, substrate transport system 699 is further comprised of a locking device 733. The locking device 733 engages a recess (not shown) in shell 607, temporarily coupling shell 607 to second storage rack 731.

An exemplary method for transitioning a substrate, such as substrate 601, from atmospheric pressure to vacuum in a lithography tool using a substrate transport system in accordance with an embodiment of the present invention will now be described with reference to FIG. 7A-7H.

Referring to FIG. 7A, upon arriving at the lithography tool, box 701 containing a removable substrate transport cassette 600 and substrate 601 (box-cassette-substrate arrangement) is temporarily placed on a shelf 707 of a first storage rack 709. Upon receiving a request for bringing a specific substrate, for example, substrate 601, into the vacuum process chamber, atmospheric robot 717 takes the box-cassette-substrate arrangement from first storage rack 709 and transports it to a detacher 718 to detach the base from the lid. FIG. 7B shows base 711 resting on detacher 718. The lid 713 has already been removed and is not shown. Robot 717 holds the cassette-substrate arrangement.

Vibration, pressure shock, and turbulent air flow resulting from opening the box 701 may stir up particles that are initially resting on the internal surfaces of the box 701, such as the top-side of the base or the inner walls and ceiling of the lid 713. Particles can become detached from the surfaces and then move freely and randomly (Brownian motion) within the gas volume inside the box 701. Some particles can eventually re-deposit on the exposed surfaces of substrates within the box 701. For example, if the box 701 contains an unprotected reticle, the particles can settle on the exposed surfaces of the reticle. However, because the reticle of the present invention is completely enclosed and protected by the removable substrate transport cassette 600, the particles are impeded from reaching any surfaces of the reticle.

Referring to FIG. 7C, atmospheric robot 717 places the cassette-substrate arrangement inside loadlock 719. During this step, atmospheric-side door 721 remains open, while vacuum-side door 723 remains closed. The atmospheric robot 717 then leaves the cassette-substrate arrangement inside the loadlock 719 and withdraws. After the atmospheric robot 717 is withdrawn, atmospheric-side door 721 closes and the loadlock 719 is pumped down to vacuum. The pumpdown step is illustrated in FIG. 7D.

During pumpdown, the substrate 601 undergoes the transition from atmospheric pressure to vacuum. More particularly, gas is allowed to move out of the removable substrate transport cassette 600 through filter 621 and vent 626, but particles that are outside the removable substrate transport cassette 600 are impeded from entering the removable substrate transport cassette 600 and contaminating the substrate 601. During pumpdown of the loadlock 719, some of the particles that are resting on the internal surfaces of the loadlock 719 may be stirred up and begin to move freely and randomly within the loadlock 719. Likewise, particles that are resting on the external surfaces of the removable substrate transport cassette 600 may also become detached and begin to move freely and randomly within the loadlock 719. However, none of the particles are able to reach the substrate 601, because the filter 621 and vent 626 along with the solid walls of the removable substrate transport cassette 600 are impenetrable barriers to particles.

It is possible that there are some particles resting on the interior walls of the removable substrate transport cassette 600 when the substrate 601 is first placed inside the removable substrate transport cassette 600. To minimize the presence of these interior particles, the interior surfaces of the removable substrate transport cassette 600 should be thoroughly cleaned before introducing the substrate 601. However, as would be apparent to one skilled in the relevant arts, it is nearly impossible to eliminate every particle, even with the best available cleaning techniques. Therefore, the possibility of migration of any remaining interior particles to critical areas of the substrate 601 must also be minimized. Accordingly, in embodiments of the present invention, the gas flow velocity is reduced, thereby minimizing the tendency of particles to become detached from the interior walls of the removable substrate transport cassette 600. In an embodiment of the present invention, the filter 621 and vent 626 provide means of ensuring a low flow velocity inside the removable substrate transport cassette 600, because they slow down the through passage of molecules. It is important to have a sufficiently large total filter area for avoiding damage that may occur to the filter 621 if too much of a pressure difference is allowed to develop across the thickness of the filter. Such potential for damage is created by excessively restricting the total amount of open area available for gas molecules to leave the removable substrate transport cassette 600. In addition, using a filter that excessively restricts gas flow requires long pump down times, which may decrease the throughput of the lithography tool, resulting in adverse economical impact.

It has been observed that gas flow affects the behavior of particles resting on surfaces differently, depending on the size of the particles. Larger particles (e.g., >5 microns) tend to become detached easily, while smaller particles (e.g., <0.1 micron) tend to cling tenaciously to surfaces. The larger the particle, the more likely it is to come off a surface for a given gas flow velocity. Fortunately, for this same reason, larger particles are also easier to clean off from surfaces, which means that they are unlikely to be found inside a thoroughly cleaned removable substrate transport cassette 600. Therefore, in an embodiment of the invention, it is adequate to remove the gas in the removable substrate transport cassette 600 at a rate (henceforth "maximum allowable gas flow velocity") just low enough not to dislodge particles equal to or smaller than a given size, for example 1 micron, which is somewhat greater than the particle size that can be removed efficiently by the cleaning process, for example 0.5 micron. Statistically in this example, since particles >0.5 micron are unlikely to be present after cleaning, and since the flow speed is less than what is likely to disturb particles >1 micron, it is very unlikely that any remaining particles (<0.5 micron) will become detached from the interior surfaces of the removable substrate transport cassette during a pressure transition. The maximum allowable gas flow velocity should be measured inside the removable substrate transport cassette at locations near the filter 621 since velocity increases as one approaches the inlet or outlet orifice of a container.

An even greater measure of protection can be attained by protecting sensitive areas of the substrate 601 from particles by attaching a removable cover to the substrate 601. Accordingly, in an embodiment of the present invention, a removable cover, such as a pellicle, disclosed in U.S. Pat. No. 6,239,863 (cited above) is attached to the reticle and the covered reticle is enclosed inside the removable substrate transport cassette 600. Unless otherwise noted, the words "mask" and "reticle" refer both to bare reticles and to reticles protected by a removable cover in the context of the present invention.

Referring to FIG. 7E, after pump-down, vacuum-side door 723 opens and vacuum robot 727 reaches into loadlock 719. After coupling itself to the cassette-substrate arrangement using locator pairs 617 and 619, robot 727 removes the cassette-substrate arrangement from loadlock 719 and brings it into process chamber 725.

Referring to FIG. 7F, vacuum robot 727 places the cassette-substrate arrangement on second storage shelf 729 and uncouples itself from the cassette-substrate arrangement. In an embodiment of the present invention, substrates remain stored inside their removable substrate transport cassette 600 within the second storage rack library until a specific substrate, for example, substrate 601 is requested for ejection from the process chamber or a specific substrate, such as substrate 601 is requested for lithographic exposure in the vacuum chamber, henceforth "processing". Where ejection from the chamber is requested, the cassette-substrate arrangement containing the specified reticle is removed by following the steps described above in exact reverse order. Further steps for processing the substrate 601 in the lithographic exposure stage of the process chamber will now be described with reference to FIGS. 7G and 7H.

Referring to FIG. 7G, as vacuum robot 727 approaches to attach itself to the cassette-substrate arrangement, locking device 733 deploys, engaging a recess (not shown) in shell 607. In this way, the locking device 733 temporarily couples shell 607 to second storage rack 731.

Figure 7H:
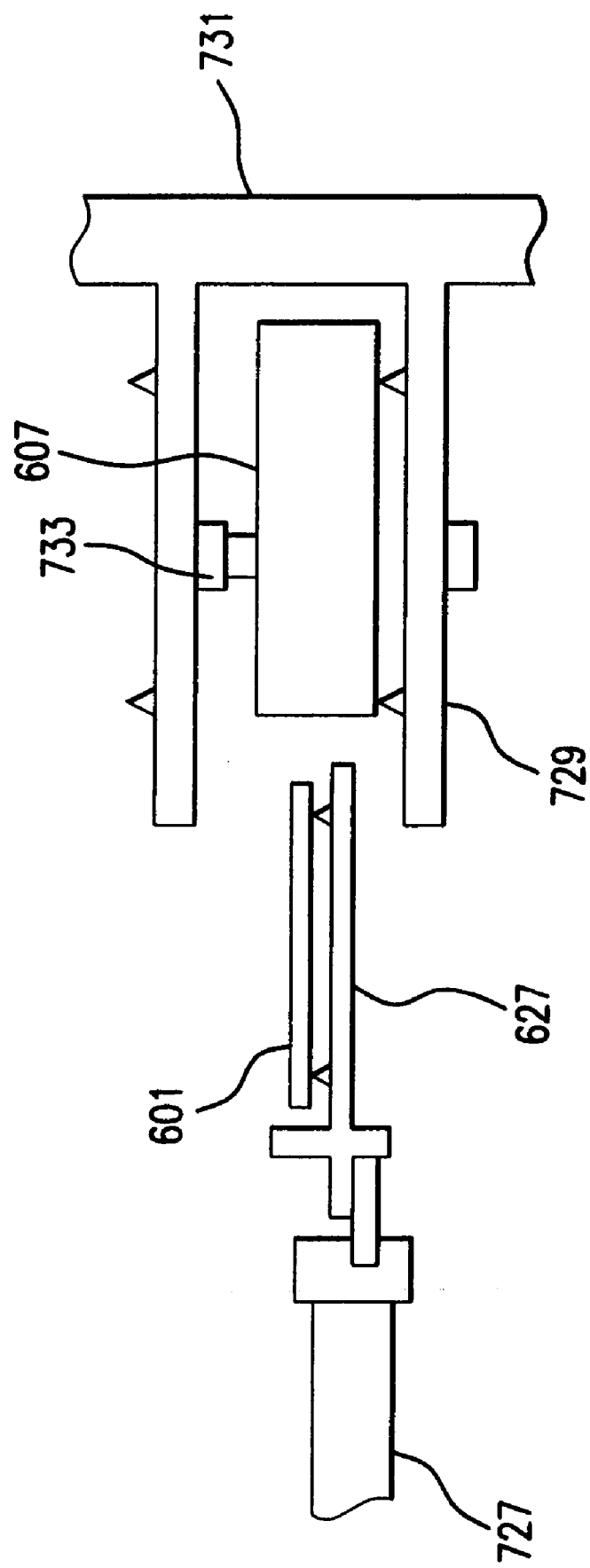

Referring to FIG. 7H, vacuum robot 727 pulls substrate transporter 627 containing substrate 601, separating it from shell 607, which remains empty on shelf 729 of second storage rack 731. Although not shown, from here, the vacuum robot 727 places the substrate 601 on the mount or chuck of a stage (not shown). Substrate 601 is then separated from substrate transporter 627. In an embodiment of the present invention, during and after chucking, the substrate transporter 627 remains coupled to the vacuum robot 727. Removal of the substrate 601 from the stage, replacement of the substrate transporter 627 and substrate 601 in the empty shell 607, which remained in the second storage rack 731, and release of the locking device 733 follow the above steps in exact reverse order.

Figure 8:
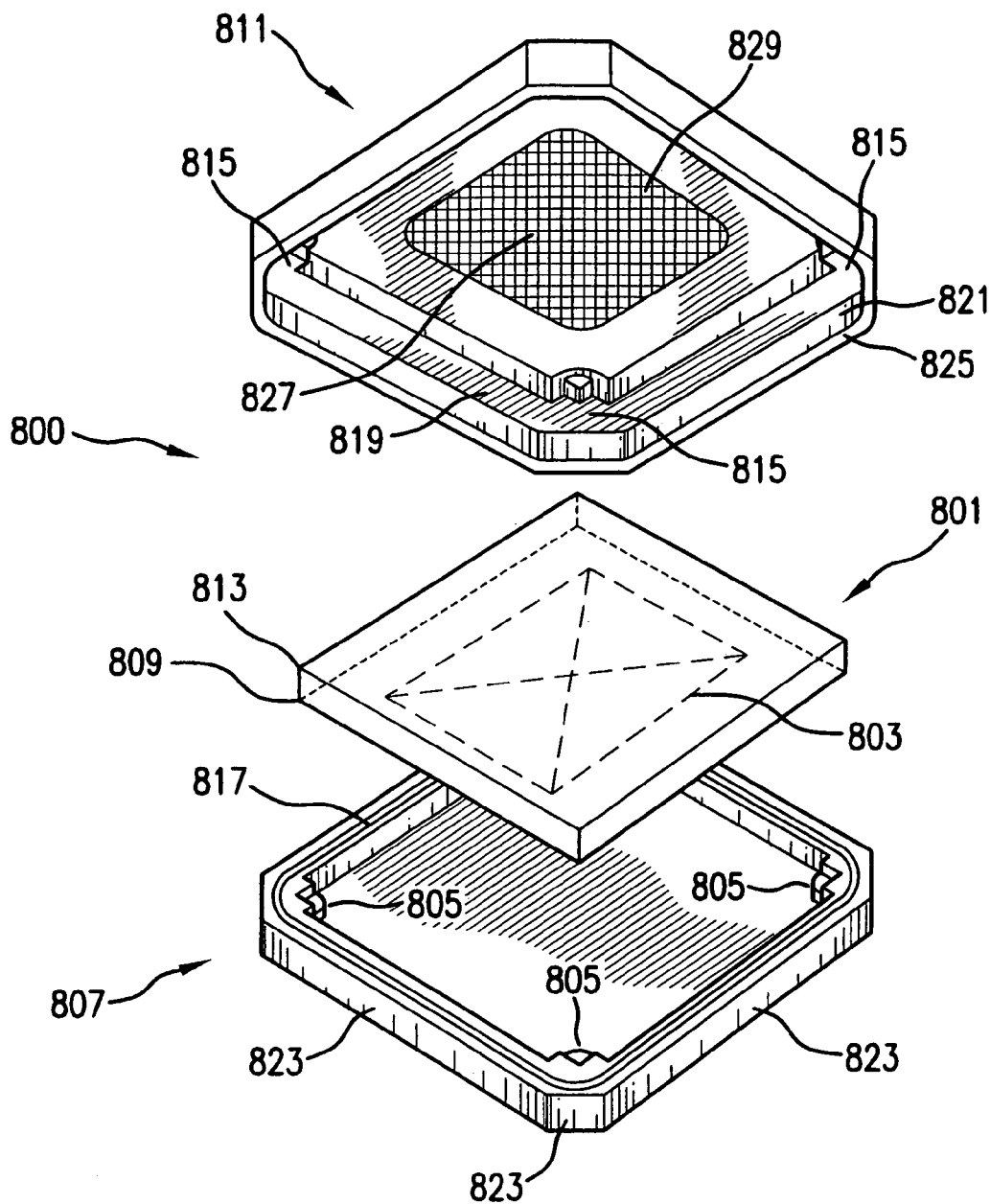
FIG. 8 is an illustration of a removable substrate transport cassette according to an embodiment of the present invention.

An alternative embodiment of a removable substrate transport cassette is illustrated in FIG. 8. Referring to FIG. 8, a removable substrate transport cassette 800 comprising base portion 807 and top portion 811 is shown. A substrate 801 having downward-facing patterned area 803 (depicted by the dashed X-ed rectangle), rests on the removable substrate transport cassette's 800 bottom portion 807. More specifically, lower corners 809 of the substrate nest inside base portion locators 805 of base portion 807. The removable substrate transport cassette's top portion 811, henceforth "top" rests on the substrate 801. More specifically, upper corners 813 of the substrate 801 fit inside the nest formed by top portion locators 815 in top 811. With substrate 801 nested in the base portion 807 and top 811 resting on the substrate, seal 817 interfaces with first surface 819. The purpose of seal 817 is to prevent particles from entering the removable substrate transport cassette 800. Seal 817 can be permeable to gases but not particles. For example, in an embodiment, the seal 817 can be a "tortuous path seal", comprising a raised surface with protruding concentric vertical flanges that loosely fit into corresponding grooves in first surface 819. Alternatively, seal 817 can be chosen to be impermeable to both gases and particles. For example, in an embodiment, seal 817 is an O-ring type elastomer seal, as depicted in FIG. 8. With top 811 in place, edge band 821 loosely surrounds the base portion's side edges 823. The purpose of edge band 821 is to further impede the migration of particles from outside to inside the removable substrate transport cassette 800, by creating a more tortuous path. The edge band 821 is further used to provide a second surface 825 that can be used to support top 811 when the removable substrate transport cassette 800 is held in an open state for extracting the substrate 801. A filter 827 and vent 829 are located towards the blank side of the substrate, facing away from patterned area 803. Filter 827 and vent 829 allow gases to move freely in and out of the closed removable substrate transport cassette 800, but impede the through flow of particles. A substrate transport system comprising a removable substrate transport cassette 800 in accordance with embodiments of the present invention will now be described with reference to FIGS. 9A-9B and 9H-9J.

Referring to FIG. 9A, in an embodiment of the present invention, a substrate transport system 999 is comprised of a box 903. Box 903 is used to contain removable substrate transport cassette 800 and substrate 801. A popular type of box is the "Standard Mechanical Interface (SMIF) reticle pod". Henceforth, however, "box" will be used generically to describe any airtight container having a substantially planar base 919 and a detachable lid 915 in which the substrate 801 is transported from machine to machine. A handle 905 coupled to lid 915 enables a manipulator or motion device, henceforth "atmospheric robot" 901 to pick up box 903 by handle 905. Latching means (not shown) keep the base 919 and the lid 915 temporarily coupled. A seal (not shown) between the base 919 and the lid 915 prevents gas and particles from flowing in and out of the box 903.

In an embodiment of the present invention the substrates 801 and the removable substrate transport cassettes 800 would be stored and transported inside the box 903. Each substrate 801 would be inside its own removable substrate transport cassette 800 (thereby forming a cassette-substrate arrangement), which in turn would be inside the box 903 (thereby forming a box-cassette-substrate arrangement). For simplicity and clarity, the descriptions herein are limited to boxes that hold only one substrate, but it will be immediately apparent that boxes holding a plurality of substrates can also be handled by the present invention. For example one type of SMIF reticle pod presently in use can hold up to six reticles.

In an embodiment of the present invention, the box-cassette-substrate arrangement is temporarily placed on a shelf 909 of a first storage rack 911. In an embodiment, the first storage rack 911 is an "out of vacuum (OOV) rack".

Figure 9B:
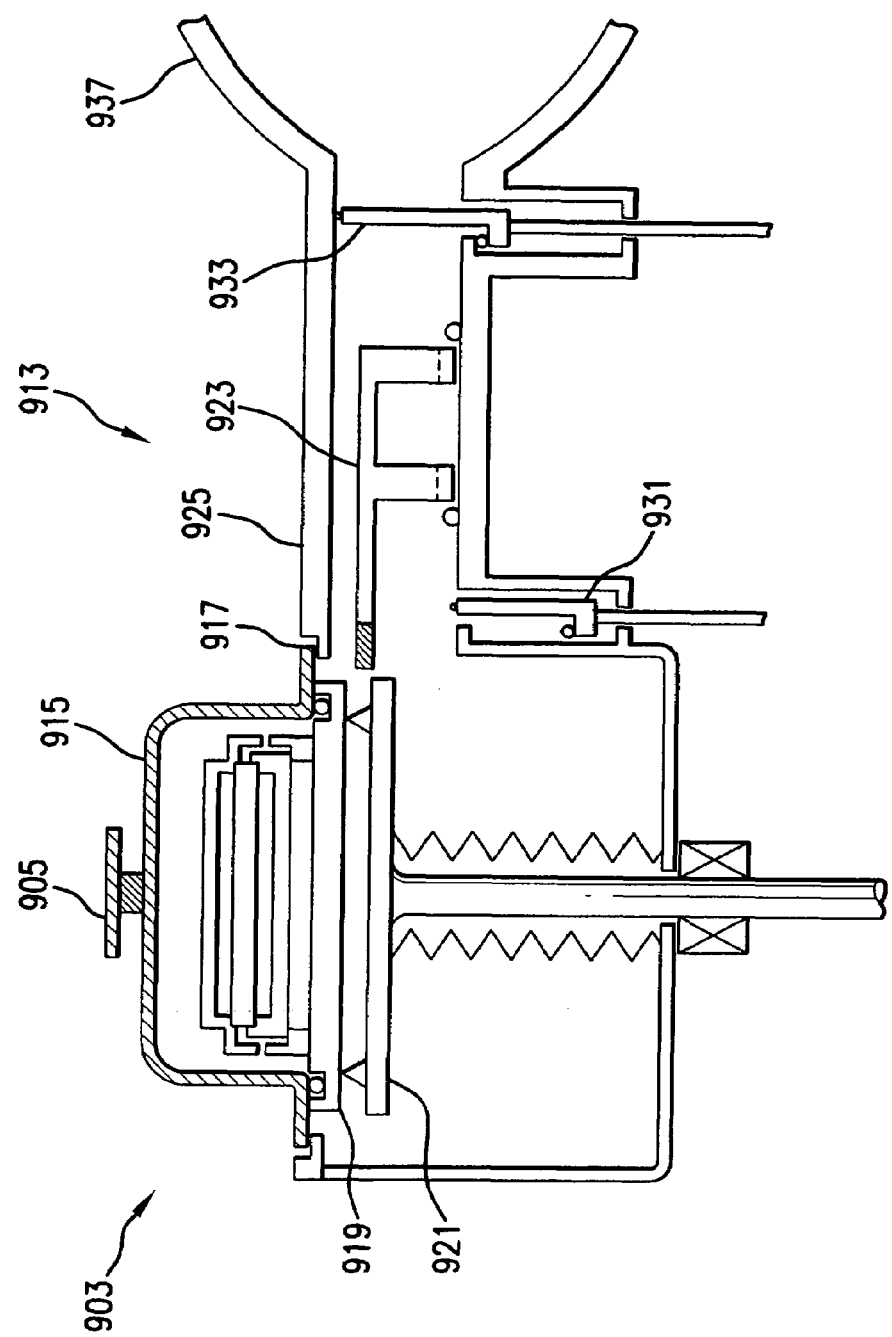

Referring to FIG. 9B, in an embodiment of the present invention, the substrate transport system 999 is further comprised of an entry-exit module 913. The entry-exit module 913 is comprised of a detacher (not shown), a loadlock 925, and a transfer shuttle 923. Still further, in an embodiment, entry-exit module 913 is further provided with a ledge 917 and an elevator 921. In yet another embodiment, the entry-exit module 913 is comprised of an atmospheric-side gate valve 931, a vacuum-side gate valve 933, and a process chamber 937.

In an embodiment, the compact arrangement of the entry-exit module 913 greatly reduces the range of motion required from the atmospheric robot 901. In this way, the use of a much smaller atmospheric robot 901 is possible. The ability to use a smaller atmospheric robot 901 frees up valuable space, which is generally very scarce in a lithography tool. In addition, the use of a smaller atmospheric robot 901 in accordance with an embodiment of the present invention reduces the amount of heat and vibrations generated by the robot 901. Heat and vibrations are major sources of performance degradation in lithography tools.

Figure 9C:
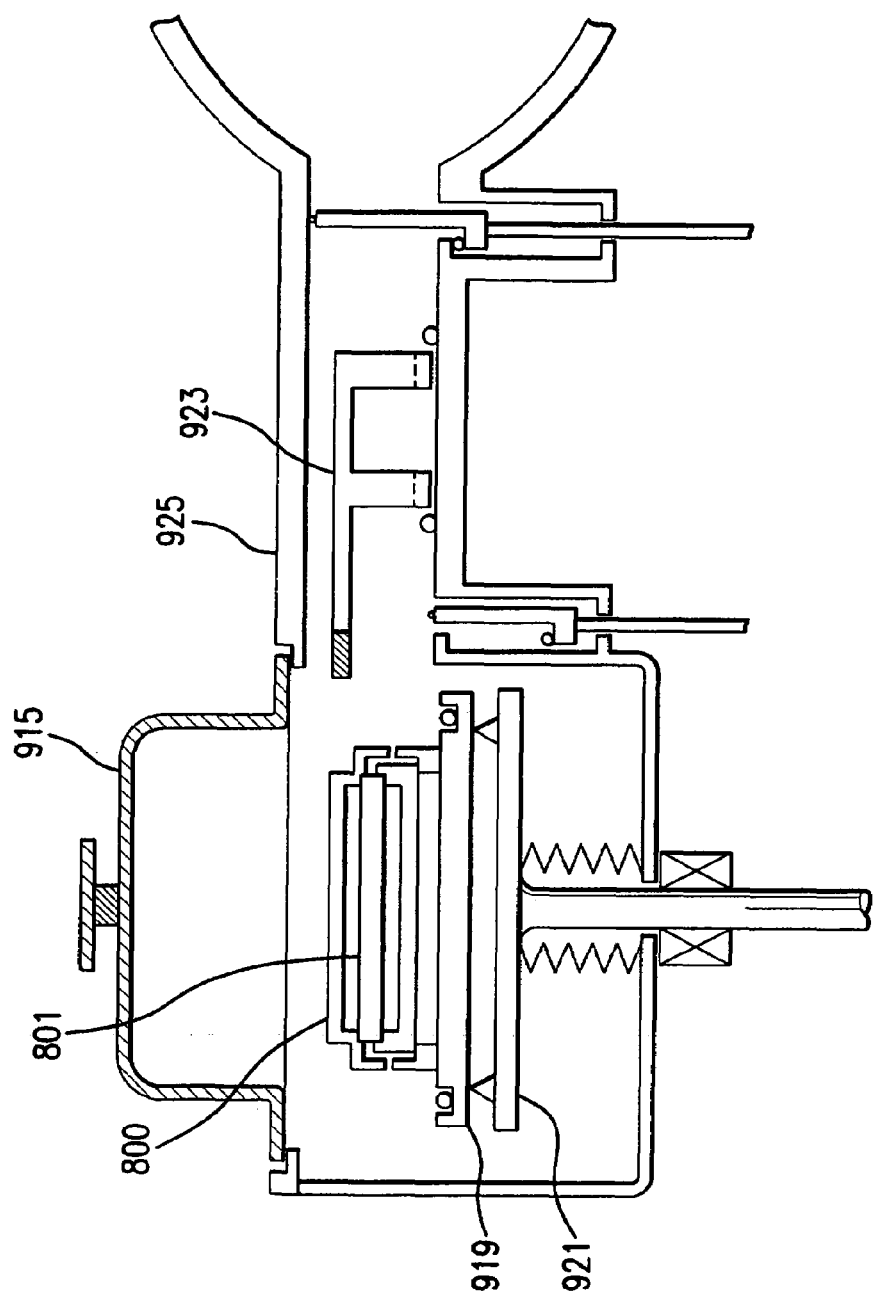
Figure 9D:
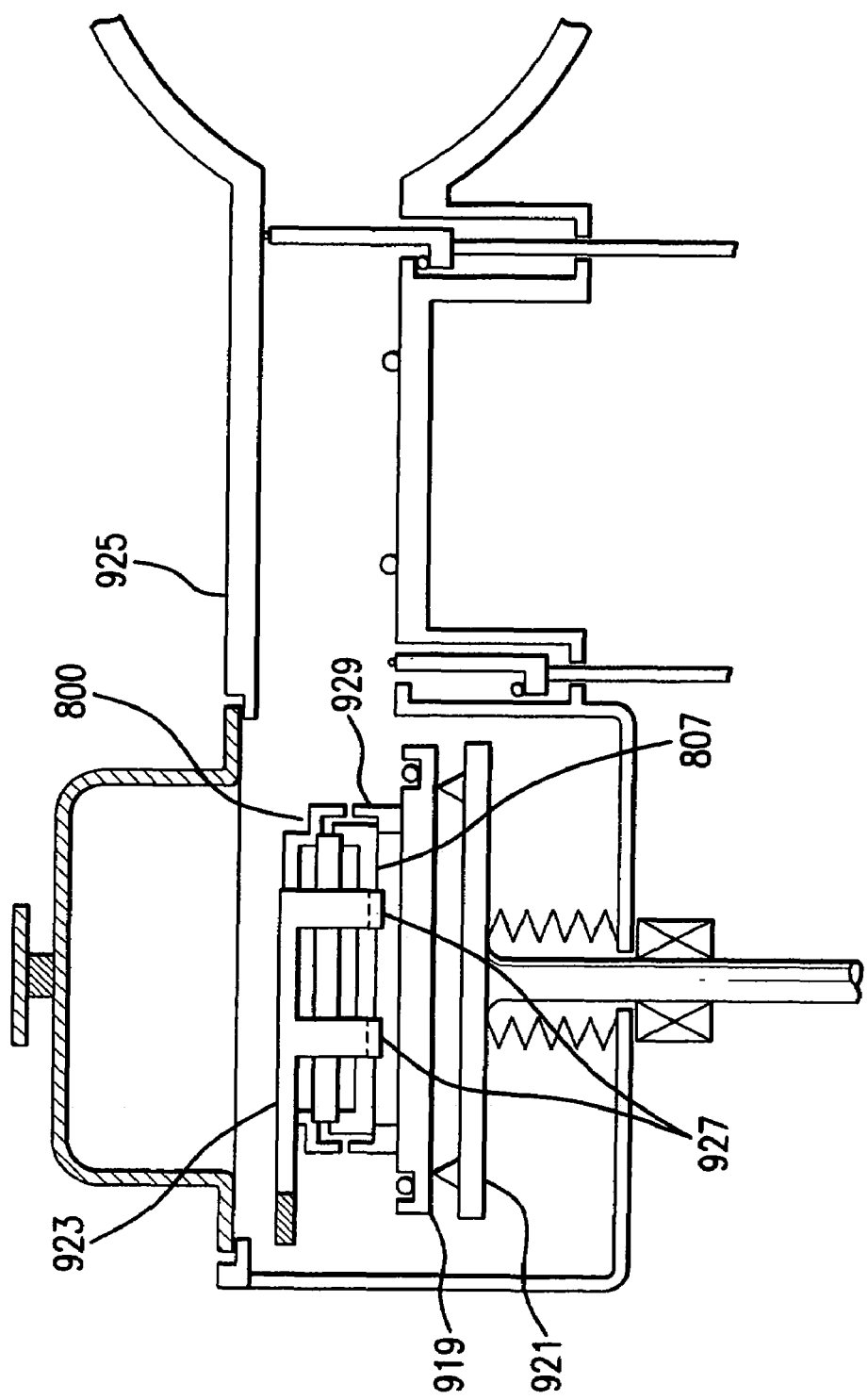
Figure 9E:
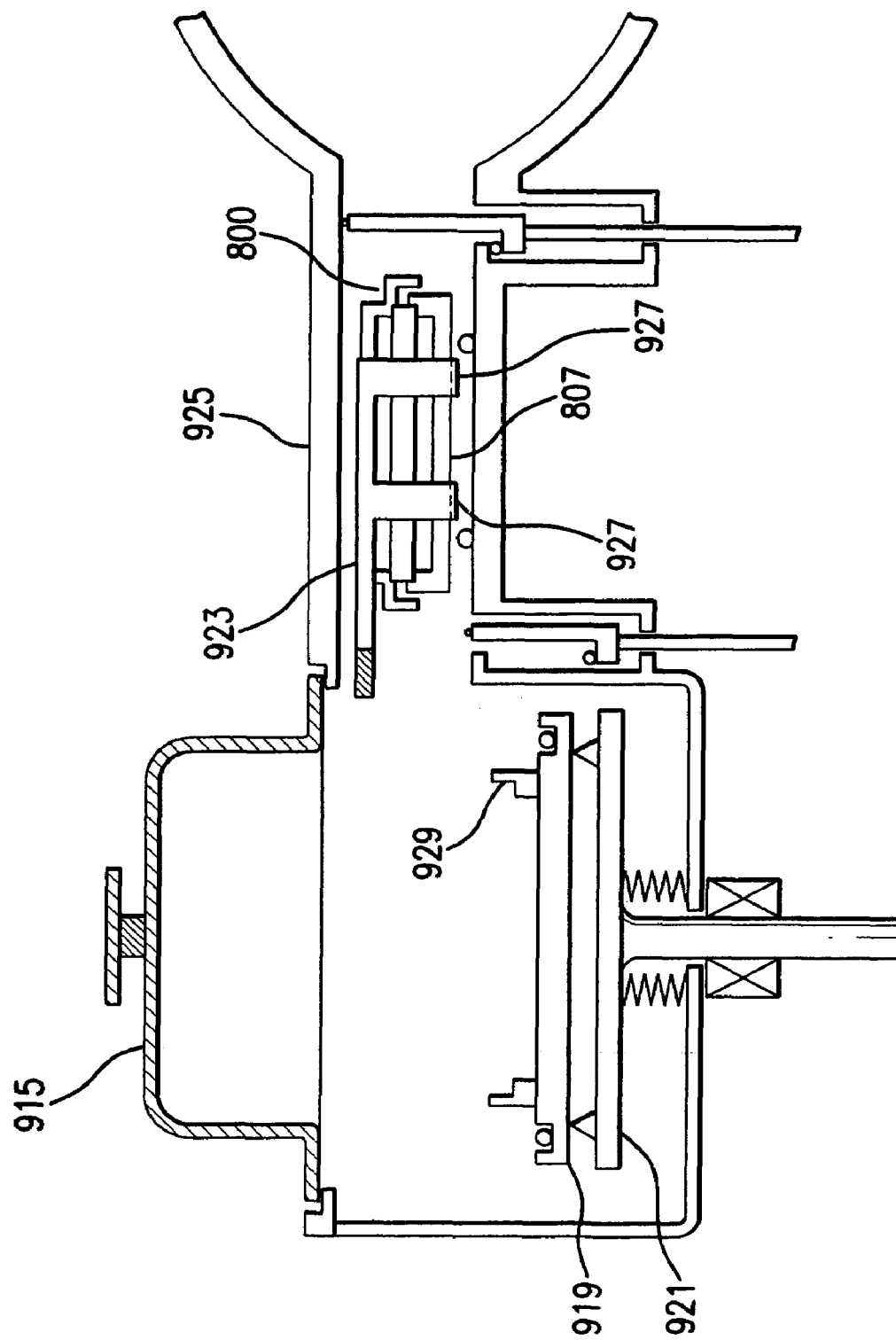
Figure 9F:
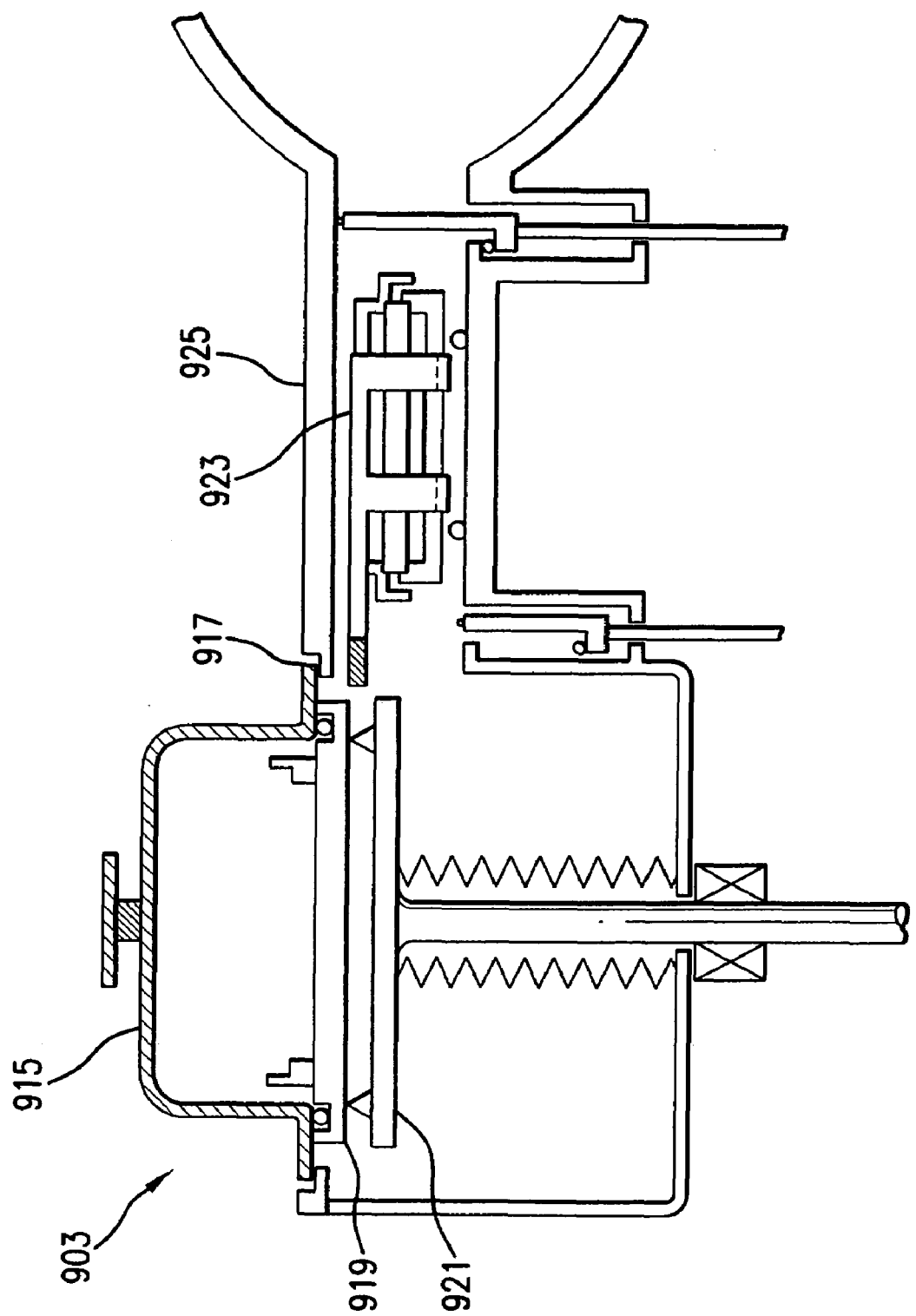
Figure 9G:
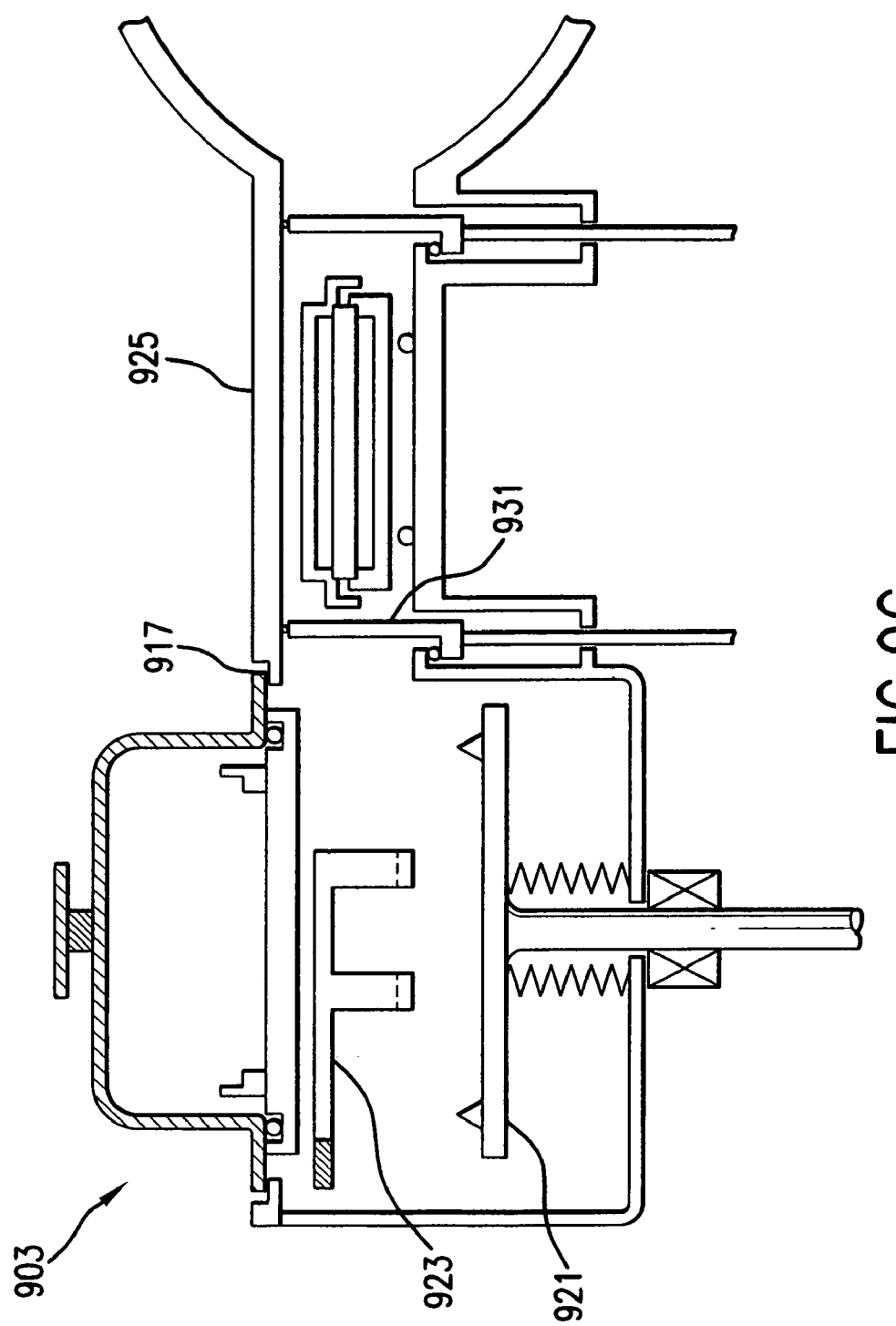
Figure 9H:
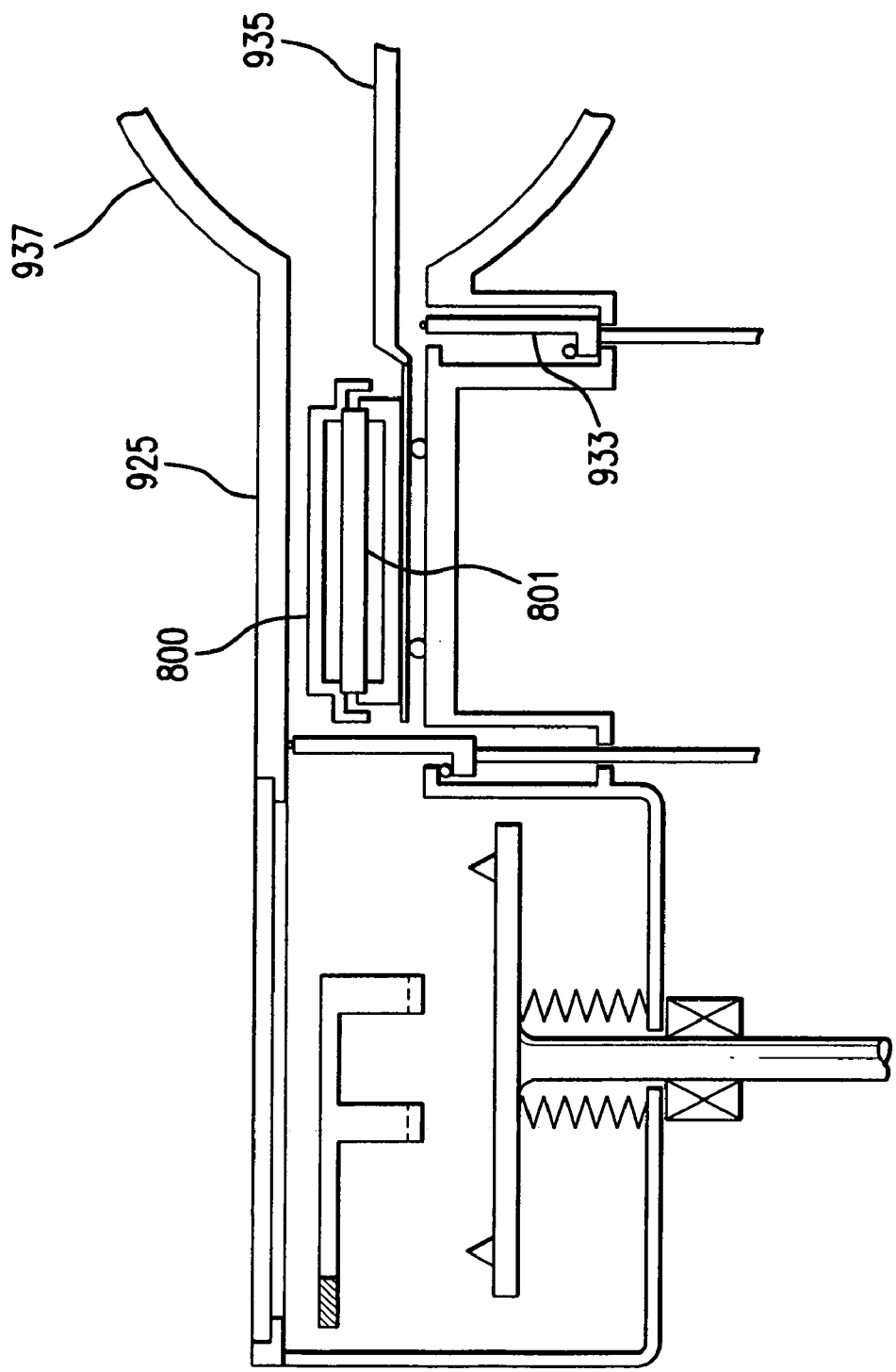
Figure 91:
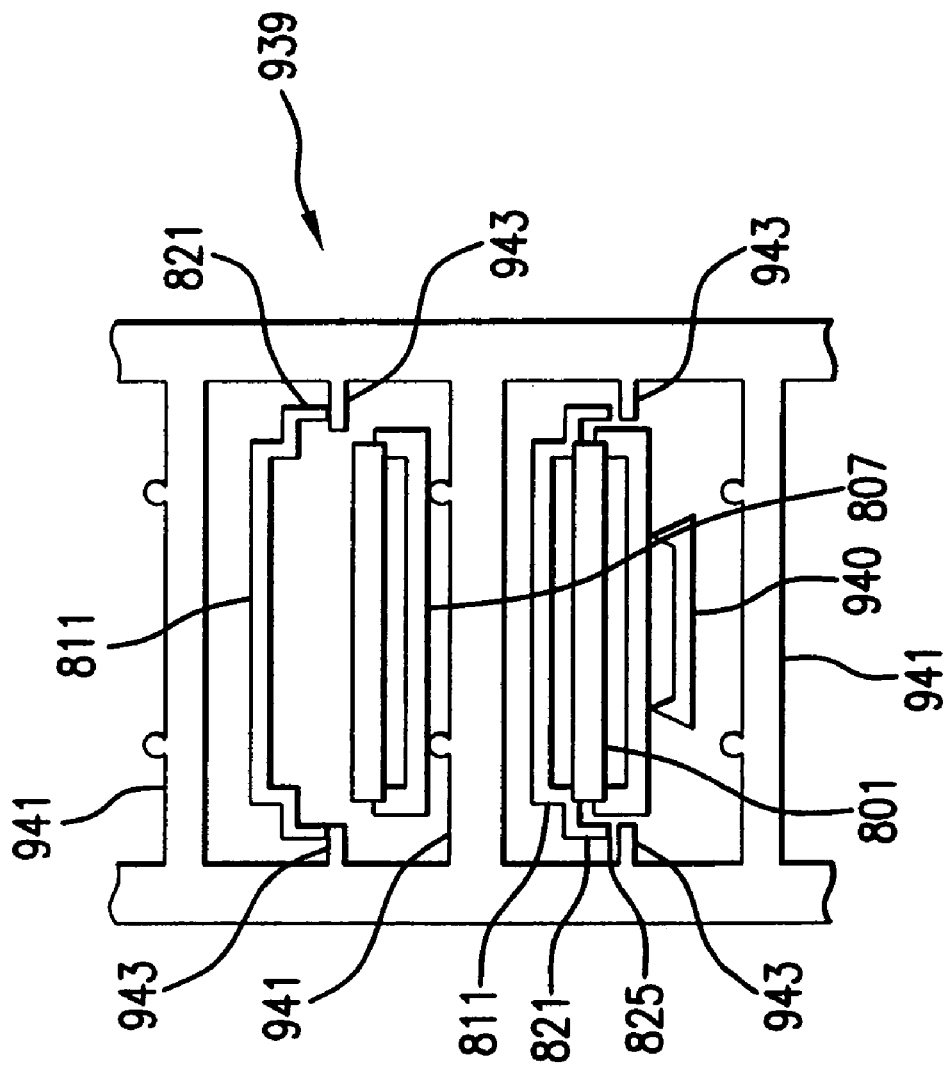

As shown in FIG. 9H, in yet another embodiment of the present invention, entry-exit module 913 is further comprised of a vacuum robot 935.

FIG. 9I shows a simplified front view of a second storage rack 939. In an embodiment of the present invention, the vacuum robot 935 transfers the cassette-substrate arrangement to the second storage rack 939 which is located within process chamber 937. The second storage rack 939 is provided with a plurality of shelves 941 and ledges 943. Further features for processing the substrate in a lithographic exposure stage of the process chamber 937 will now be described with reference to FIG. 9J.

Referring to FIG. 9J, in preparation for lithographic exposure, vacuum robot 935 places substrate 901 onto a chuck 945 of a lithographic exposure stage 947. Chuck 945 can be, for example, an electrostatic chuck used to develop a reticle-clamping force when energized or electrically charged, and to release the reticle when de-energized, shorted or otherwise electrically discharged.

An exemplary method for transitioning a substrate from atmospheric pressure to vacuum in a lithography tool using a substrate transport system in accordance with an embodiment of the present invention will now be described with reference to FIGS. 9A-9K.

In FIG. 9A, atmospheric robot 901 is shown placing box-cassette-substrate arrangement (box 903 containing removable substrate transport cassette 800 and substrate 801) on a shelf 909 in first storage rack 911. Upon request for a specific reticle, atmospheric robot 901 transfers the box-cassette-substrate arrangement from rack 911 to entry-exit module 913 shown in FIG. 9B.

Referring to FIG. 9B, box lid 915 rests on ledge 917 of the module 913. A detacher (not shown) unlatches box lid 915 from base 919. Base 919 rests on elevator 921.

Next, as shown in FIG. 9C, elevator 921 lowers base 919, which supports the cassette-substrate arrangement (removable substrate transport cassette 800 containing substrate 801) away from lid 915. Shuttle 923 remains parked inside loadlock 925, thus allowing elevator 921, base 919 and the cassette-substrate arrangement to move down past shuttle 923 without colliding.

Referring to FIGS. 9D and 9E, shuttle 923 moves to the cassette-substrate arrangement and grabs it. Then elevator 921 further lowers base 919 so that the shuttle 923 can move past base locators 929. At this point, the base portion 807 of the cassette-substrate arrangement rests solely on shuttle fingers 927. Shuttle 923 then moves the cassette-substrate arrangement into loadlock 925.

Turning to FIGS. 9F and 9G, with shuttle 923 still inside loadlock 925, elevator 921 raises base 919 up to lid 915. The box latching/unlatching device (not shown), latches the base 919 and the lid 915 together. At this point, elevator 921 moves down, leaving box 903 resting on ledge 917.

If desired, the atmospheric robot 901 can now remove the empty box 903 and replace it with another box-cassette-substrate arrangement. For example, in a lithography tool having two entry-exit modules 913, a first module 913 can be dedicated to performing the substrate input function and a second module 913 can be dedicated to performing the substrate output function. In that case, the atmospheric robot 901 would remove empty boxes 903 from the first module 913 and place them in the second module 913 for accepting already processed reticles. The atmospheric robot 901 would then remove the box 903 containing the processed substrate from the second module 913 and place it in the storage rack. Next, the atmospheric robot 901 would take the box 903 containing the next substrate to be processed from the storage rack and place it in the first module 913. On the other hand, in a lithography tool having only one entry-exit module 913, the module 913 would be used for both input and output of reticles. In this case, it is likely that the atmospheric robot 901 would wait until the reticle has been processed and is back inside its box 903 before removing the box 903. Other sequences that maximize production throughput for tools having a single or multiple entry-exit modules 913 will be apparent to those skilled in the relevant arts based on the disclosures herein. These sequences may or may not require removal of empty boxes 903 from entry-exit modules 913 for maximizing throughput.

With elevator 921 out of its way, as shown in FIG. 9G, shuttle 923 retracts over the elevator 921 clearing the way for atmospheric-side gate valve 931 to close. Loadlock 925 is then pumped down. As explained above, box 903 may or may not be present at this point.

Referring to FIG. 9H, once the desired vacuum level has been achieved inside loadlock 925, vacuum-side gate valve 933 opens, vacuum robot 935 reaches into loadlock 925 and picks up the cassette-substrate arrangement, bringing it inside process chamber 937.

Turning to FIG. 9I, vacuum robot 935 next transfers the cassette-substrate arrangement to second storage rack 939 within process chamber 937. FIG. 9I shows a simplified front view of the second storage rack 939, having shelves 941 and ledges 943. In this view, the direction of insertion and removal of reticles is perpendicular to the page. Referring to the lower half of FIG. 9I, the end effector 940 of vacuum robot 935 is shown inserting the cassette-substrate arrangement onto bottom shelf 941. In an embodiment, the insertion takes place at a level high enough to avoid interference of edge band 821 of top 811 with ledges 943. After performing the horizontal insertion motion, using end effector 940, vacuum robot 935 lowers the bottom portion 807 onto bottom shelf 941 and withdraws.

Referring to the upper half of FIG. 9I, bottom portion 807 is shown resting on middle shelf 941 after being placed there by the vacuum robot 935. During said downward robot motion, surface 825 of edge band 821 comes to rest on ledges 943, thus causing top portion 811 to separate from baseplate 807, which continues on downward until reaching shelf 941. Thus, in an embodiment, all the cassette-substrate arrangements are stored in the second storage rack in an open condition. After inserting its end effector portion between shelf 941 and baseplate 807, vacuum robot 935 can extract bottom portion 807 and substrate 801 for mounting substrate 801 onto the stage by performing a short upward motion. This motion provides for the removal of the bottom portion 807 and substrate 801, but not top portion 811. Further details of this process will be described below. After the short upward motion, substrate 801 does not contact top portion 811, which is still supported by ledges 943. Next, vacuum robot 935 extracts base portion 807 and substrate 801 using a horizontal motion perpendicular to the page, leaving top portion 811 resting on ledges 943. For ejecting a substrate from the litho tool, vacuum robot 935 removes the entire cassette-substrate arrangement by following the insertion motion sequence in exact reverse order, as explained above and as illustrated in the bottom half of FIG. 9I. Further steps for processing the substrate in a lithographic exposure stage of the process chamber 937 will now be described with reference to FIGS. 9J and 9K.

In preparation for lithographic exposure, vacuum robot 935 places substrate 801 onto chuck 945 of lithographic exposure stage 947. Vacuum robot 935 first moves upwards until substrate 801 contacts chuck 945. Next, chuck 945 is energized, thereby clamping the substrate 801. (FIG. 9J) Afterwards, the vacuum robot 935 moves downward, leaving substrate 801 attached to the chuck 945 but carrying away base portion 807 which is not attracted to the chuck 945. (FIG. 9K) Release and removal of the substrate from the exposure stage 947 follows the sequence in exact reverse order.

Programmed computer systems are used to execute programs directing the manipulation of substrates, components, and other features of lithography systems. Based on the teachings described herein, the design of programs for implementing the systems and methods of the present invention will be apparent to persons skilled in the relevant arts.

CONCLUSION

While various embodiments of the present invention have been described above, it should be understood that they have been presented by way of example only, and not limitation. It will be understood by those skilled in the art that various changes in form and details can be made herein without departing from the spirit and scope of the invention, as defined in the appended claims. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A substrate transport system for transitioning a substrate from atmospheric pressure to vacuum in a lithography tool, comprising:
   one or more removable substrate transport cassettes, each removable substrate transport cassette having at least one vent and at least one filter, and each removable substrate transport cassette supporting one substrate forming a cassette-substrate arrangement, wherein said at least one filter and said at least one vent are located opposite a patterned side of the substrate;
   a box having a base and a lid, wherein said box holds one or more of said cassette-substrate arrangements, forming a box-cassette-substrate arrangement;
   a first storage rack having one or more shelves for holding said box-cassette-substrate arrangement; and
   an entry-exit module having a loadlock that transitions said cassette-substrate arrangement from atmospheric pressure to vacuum, said at least one vent and said at least one filter restricting particles within said loadlock from entering said cassette-substrate arrangement and reaching a surface of the substrate.

2. The substrate transport system of claim 1, wherein said entry-exit module further comprises an atmospheric de-podder.

3. The substrate transport system of claim 1, wherein said entry-exit module further comprises an elevator that raises and lowers said cassette-substrate arrangement.

4. The substrate transport system of claim 1, wherein said entry-exit module further comprises a shuttle that engages said cassette-substrate arrangement and transports said cassette-substrate arrangement into said loadlock.

5. The substrate transport system of claim 1, further comprising a process chamber that receives said cassette-substrate arrangement after said cassette-substrate arrangement has been transitioned to vacuum.

6. The substrate transport system of claim 5, further comprising a second storage rack within said process chamber, said second storage rack having a plurality of shelves to store said cassette-substrate arrangement.

7. The substrate transport system of claim 1, wherein each removable substrate transport cassette compnses:
   a base portion and a top portion;
   one or more base portion locators disposed within said base portion that supports one or more lower corners of the substrate; and
   one or more upper portion locators disposed within said top portion in which one or more upper corners of the substrate are fitted.

8. The substrate transport system of claim 7, wherein each removable substrate transport cassette further comprises a seal that seals said base portion and said top portion after the substrate has been positioned within the removable substrate transport cassette.

9. The substrate transport system of claim 8, wherein said seal is permeable to gases but substantially impermeable to particles.

10. The substrate transport system of claim 8, wherein said seal is comprised of a raised surface with protruding concentric vertical flanges that fit into one or more corresponding grooves on said top portion.

11. The substrate transport system of claim 8, wherein said seal is impermeable to gases and substantially impermeable to particles.

12. The substrate transport system of claim 8, wherein said seal is an O-ring elastomer seal.

13. The substrate transport system of claim 7, wherein each removable substrate transport cassette further comprises an edge band surrounding one or more side edges of said base portion, wherein said edge band impedes the migration of particles from outside the removable substrate transport cassette to inside and further wherein said edge band provides a surface to support said top portion.

14. A method for transitioning a substrate from atmospheric pressure to vacuum in a lithography tool, comprising:
   (a) loading the substrate into a removable substrate transport cassette to produce a cassette-substrate arrangement, such that at least one vent and at least one filter of said removable substrate transport are located opposite a patterned side of the substrate;

(b) loading said cassette-substrate arrangement into a box to produce a box-cassette-substrate arrangement, said box comprised of a base and a lid;

(c) transporting said box-cassette-substrate arrangement to a shelf of a first storage rack;

(d) transporting said box-cassette-substrate arrangement out of vacuum from said first storage rack to an entry-exit module;

(e) unlatching a lid of said box from a base of said box;

(f) lowering said base on an elevator, said base supporting said cassette-substrate arrangement;

(g) engaging said cassette-substrate arrangement with a shuttle;

(h) using said shuttle to transport said cassette-substrate arrangement into a loadlock; and (i) transitioning said loadlock from atmospheric pressure to vacuum, wherein during transitioning, said at least one vent and said at least one filter restrict particles within said loadlock from entering said cassette-substrate arrangement and reaching a surface of the substrate.

15. The method of claim 14, further comprising transporting said cassette-substrate arrangement from said loadlock to a process chamber after completing said transitioning step (i).

16. The method of claim 15, further comprising storing said cassette-substrate arrangement on a shelf in a second storage rack located within said process chamber.

17. The method of claim 16, wherein said storing step comprises inserting said cassette-substrate arrangement so that an edge band of said removable substrate transport cassette is above a set of ledges associated with a shelf of an in-vacuum library.

18. The method of claim 17, further comprising lowering said removable substrate transport cassette so that a base portion of said removable substrate transport cassette rests on a surface of said shelf and a top portion of said removable substrate transport cassette rests on said set of ledges associated with said shelf.

19. A substrate transport system for transitioning a substrate from atmospheric pressure to vacuum in a lithography tool, comprising:

one or more removable substrate transport cassettes, each removable substrate transport cassette having a base portion and a top portion, each removable substrate transport cassette having at least one vent and at least one filter, and each removable substrate transport cassette supporting one substrate forming a cassette-substrate arrangement;

a box having a base and a lid, wherein said box holds one or more of said cassette-substrate arrangements, forming a box-cassette-substrate arrangement;

a first storage rack having one or more shelves for holding said box-cassette-substrate arrangement;

an entry-exit module having a loadlock that transitions said cassette-substrate arrangement from atmospheric pressure to vacuum, said at least one vent and said at least one filter restricting particles within said loadlock from entering said cassette-substrate arrangement and reaching a surface of the substrate;

a process chamber that receives said cassette-substrate arrangement after said cassette-substrate arrangement has been transitioned to vacuum; and a second storage rack within said process chamber, said second storage rack having a plurality of shelves with associated sets of ledges, wherein the removable substrate transport cassette can be stored on a particular shelf by resting the top portion of the removable substrate transport cassette on a set of ledges associated with the particular shelf and lowering the base portion of the removable substrate transport cassette onto a surface of the shelf.

20. A method for transitioning a substrate from atmospheric pressure to vacuum in a lithography tool, comprising:

(a) loading the substrate into a removable substrate transport cassette to produce a cassette-substrate arrangement, wherein said removable substrate transport cassette has at least one vent and at least one filter;

(b) loading said cassette-substrate arrangement into a box to produce a box-cassette-substrate arrangement, said box comprised of a base and a lid;

(c) transporting said box-cassette-substrate arrangement to a shelf of a first storage rack;

(d) transporting said box-cassette-substrate arrangement out of vacuum from said first storage rack to an entry-exit module;

(e) unlatching a lid of said box from a base of said box;

(f) lowering said base on an elevator, said base supporting said cassette-substrate arrangement;

(g) engaging said cassette-substrate arrangement with a shuttle;

(h) using said shuttle to transport said cassette-substrate arrangement into a loadlock;

(i) transitioning said loadlock from atmospheric pressure to vacuum, wherein during transitioning, said at least one vent and said at least one filter restrict particles within said loadlock from entering said cassette-substrate arrangement and reaching a surface of the substrate;

(j) transporting said cassette-substrate arrangement from said loadlock to a process chamber;

(k) storing said cassette-substrate arrangement on a shelf in a second storage rack located within said process chamber, wherein storing comprises inserting said cassette-substrate arrangement so that an edge band of said removable substrate transport cassette is above a set of ledges associated with a shelf; and (l) lowering said removable substrate transport cassette so that a base portion of said removable substrate transport cassette rests on a surface of said shelf and a top portion of said removable substrate transport cassette rests on said set of ledges associated with said shelf.

* * * * *